United States Patent
Yu et al.

(10) Patent No.: US 8,225,168 B2
(45) Date of Patent: Jul. 17, 2012

(54) METHOD AND SYSTEM FOR DATA TRANSMISSION IN A MULTIPLE INPUT MULTIPLE OUTPUT (MIMO) SYSTEM

(75) Inventors: Qian Yu, Singapore (SG); Ping Luo, Singapore (SG); Masayuki Hoshino, Kanagawa (JP)

(73) Assignee: Panasonic Corporation, Osaka (JP)

( * ) Notice: Subject to any disclaimer, the term of this patent is extended or adjusted under 35 U.S.C. 154(b) by 749 days.

(21) Appl. No.: 12/445,277

(22) PCT Filed: Oct. 1, 2007

(86) PCT No.: PCT/SG2007/000332
§ 371 (c)(1),
(2), (4) Date: Apr. 10, 2009

(87) PCT Pub. No.: WO2008/048188
PCT Pub. Date: Apr. 24, 2008

(65) Prior Publication Data
US 2010/0100789 A1    Apr. 22, 2010

(30) Foreign Application Priority Data
Oct. 18, 2006   (WO) ............... PCT/SG2006/000306

(51) Int. Cl.
*H03M 13/00* (2006.01)
*H03M 13/03* (2006.01)
*G06F 11/00* (2006.01)
*H04L 5/12* (2006.01)
*H04L 27/06* (2006.01)
*H04B 17/00* (2006.01)

(52) U.S. Cl. ........ 714/752; 714/786; 714/801; 370/216; 375/262; 375/265; 375/341; 455/115.1; 455/226.1

(58) Field of Classification Search ............... 714/752, 714/786, 801; 370/216; 375/262, 265, 341; 455/115.1, 226.1
See application file for complete search history.

(56) References Cited

U.S. PATENT DOCUMENTS
5,105,442 A    4/1992  Wei
(Continued)

OTHER PUBLICATIONS

Yang, Xiumei, et al., "New Research on Unequal Error Protection (UEP) Property of Irregular LDPC Codes," *IEEE*, pp. 361-361-363 (2004).
Poulliat, Charly, et al., "Optimization of LDPC codes for UEP channels," *UMR 8051—ENSEA/University of Cergy-Pontoise/CNRS*, 6 pgs.
Rahnavard, Nazanin, et al., "New Results on Unequal Error Protection Using LDPC Codes," *IEEE Communications Letters*, vol. 10, No. 1, pp. 43-45 (Jan. 2006).

(Continued)

*Primary Examiner* — John J Tabone, Jr.
(74) *Attorney, Agent, or Firm* — Patterson Thuente Christensen Pedersen, P.A.

(57) ABSTRACT

A method for data transmission in a multiple input multiple output (MIMO) system. The method for data transmission includes receiving multiple input data streams and performing low density parity check (LDPC) encoding of the input data streams utilizing a parity check matrix. The parity check matrix comprises a plurality of sub-parity check matrices for encoding respective associated ones of the input data streams and performing space time encoding for transmitting the LDPC encoded input data streams over a plurality of antennas. The performing of the LDPC encoding of the input data streams includes generating one or more connection matrices, each connection matrix for injecting information of one of the input data streams into the encoding of another one of the input data streams. Each connection matrix is a zero matrix if a lowest parity check protection level based on the sub-parity check matrix for the one of the input data streams is equal to or lower than an assigned parity check protection level for the one input data stream, and a non zero matrix otherwise.

18 Claims, 18 Drawing Sheets

U.S. PATENT DOCUMENTS

| | | | | |
|---|---|---|---|---|
| 5,214,656 | A | 5/1993 | Chung et al. | |
| 7,389,464 | B2 * | 6/2008 | Jeong et al. | 714/752 |
| 7,516,390 | B2 * | 4/2009 | Shen et al. | 714/755 |
| 7,873,022 | B2 * | 1/2011 | Hansen et al. | 370/342 |
| 7,995,667 | B2 * | 8/2011 | Hansen et al. | 375/265 |
| 2005/0078765 | A1 * | 4/2005 | Jeong et al. | 375/267 |
| 2005/0204273 | A1 | 9/2005 | Jeong et al. | |
| 2005/0268202 | A1 | 12/2005 | Mollisch et al. | |
| 2006/0156169 | A1 | 7/2006 | Shen et al. | |
| 2009/0187804 | A1 * | 7/2009 | Shen et al. | 714/752 |
| 2010/0077275 | A1 * | 3/2010 | Yu et al. | 714/752 |
| 2010/0192038 | A1 * | 7/2010 | Eroz et al. | 714/752 |
| 2012/0014364 | A1 * | 1/2012 | Hansen et al. | 370/338 |

OTHER PUBLICATIONS

Kuo, Chih-Hung, et al., "Robust Video Transmission over Wideband Wireless Channel Using Space-Time Coded OFDM Systems," *IEEE*, pp. 931-936 (2002).

Sabir, M. Farooq, et al., "An Unequal Error Protection Scheme for Multiple Input Multiple Output Systems," *IEEE*, pp. 575-579 (2002).

Kuo, Chih-Hung, et al., "Embedded Space-Time Coding for Wireless Broadcast With Heterogeneous Receivers," *IEEE*, pp. 1749-1753 (2002).

\* cited by examiner $$\underset{800}{\nearrow} \overset{802}{\begin{bmatrix} 1 & 0 & 0 & 0 & 0 & 0 & 0 & 0 \\ 0 & 1 & 1 & 0 & 0 & 0 & 0 & 0 \\ 0 & 0 & 0 & 1 & 0 & 0 & 0 & 0 \\ 1 & 0 & 1 & 0 & 1 & 0 & 0 & 1 \\ 0 & 1 & 0 & 1 & 0 & 1 & \underset{804}{1} & 0 \end{bmatrix}}$$

Figure 8(a)

$$\begin{matrix} & & & & & 808 \\ & & & & & \diagdown \\ 1 & 0 & 1 & 0 & 0 & 0 & 0 & 1 & \vdots & 0 & 0 & 0 & 0 \\ 0 & 1 & 0 & 1 & 1 & 0 & 0 & 0 & \vdots & 0 & 0 & 0 & 0 \\ 0 & 0 & 1 & 0 & 1 & 1 & 0 & 0 & \vdots & 0 & 0 & 0 & 0 \\ 0 & 0 & 0 & 1 & 0 & 0 & 1 & 0 & \vdots & 0 & 0 & 0 & 0 \\ 0 & 1 & 0 & 0 & 0 & 0 & 1 & 1 & \vdots & 0 & 0 & 0 & 0 \\ 1 & 0 & 0 & 0 & 0 & 1 & 0 & 0 & \vdots & 0 & 0 & 0 & 0 \\ \cdots & \cdots & \cdots & \cdots & \cdots & \cdots & \cdots & \cdots & & \cdots & \cdots & \cdots & \cdots \\ 1 & 0 & 1 & 0 & 1 & 0 & 1 & 0 & \vdots & 1 & 0 & 0 & 1 \\ 0 & 1 & 0 & 1 & 0 & 1 & 0 & 1 & \vdots & 0 & 1 & 1 & 0 \end{matrix}$$

| I branch | $u_1(1)$ | $u_2(1)$ | $u_1(2)$ | $u_2(2)$ | $u_1(3)$ | $u_2(3)$ | $u_1(4)$ | $u_2(4)$ |
|---|---|---|---|---|---|---|---|---|
| Q branch | $v_1(1)$ | $v_2(1)$ | $v_1(2)$ | $v_2(2)$ | $v_1(3)$ | $v_2(3)$ | $v_1(4)$ | $v_2(4)$ |

Antenna 1 — 1102

| I branch | $u_3(1)$ | $u_4(1)$ | $u_3(2)$ | $u_4(2)$ | $u_3(3)$ | $u_4(3)$ | $u_3(4)$ | $u_4(4)$ |
|---|---|---|---|---|---|---|---|---|
| Q branch | $v_3(1)$ | $v_4(1)$ | $v_3(2)$ | $v_4(2)$ | $v_3(3)$ | $v_4(3)$ | $v_3(4)$ | $v_4(4)$ |

Antenna 2 — 1104

Figure 11(a)

| I branch | $u_1(1)$ | $u_2(1)$ | $u_5(1)$ | $u_6(1)$ | $u_1(2)$ | $u_2(2)$ | $u_5(2)$ | $u_6(2)$ |
|---|---|---|---|---|---|---|---|---|
| Q branch | $v_1(1)$ | $v_2(1)$ | $v_1(2)$ | $v_2(2)$ | $v_1(3)$ | $v_2(3)$ | $v_1(4)$ | $v_2(4)$ |

Antenna 1 — 1106

| I branch | $u_3(1)$ | $u_4(1)$ | $u_7(1)$ | $u_8(1)$ | $u_3(2)$ | $u_4(2)$ | $u_7(2)$ | $u_8(2)$ |
|---|---|---|---|---|---|---|---|---|
| Q branch | $v_3(1)$ | $v_4(1)$ | $v_3(2)$ | $v_4(2)$ | $v_3(3)$ | $v_4(3)$ | $v_3(4)$ | $v_4(4)$ |

Antenna 2 — 1108

Figure 11(b)

| I branch | $u_1(1)$ | $u_2(1)$ | $u_1(2)$ | $u_2(2)$ | $u_1(3)$ | $u_2(3)$ | $u_1(4)$ | $u_2(4)$ |
|---|---|---|---|---|---|---|---|---|
| Q branch | $v_1(1)$ | $v_2(1)$ | $v_1(3)$ | $v_2(3)$ | $v_1(5)$ | $v_2(5)$ | $v_1(7)$ | $v_2(7)$ |

Antenna 1 — 1110

| I branch | $u_3(1)$ | $u_4(1)$ | $u_3(2)$ | $u_4(2)$ | $u_3(3)$ | $u_4(3)$ | $u_3(4)$ | $u_4(4)$ |
|---|---|---|---|---|---|---|---|---|
| Q branch | $v_3(1)$ | $v_4(1)$ | $v_3(3)$ | $v_4(3)$ | $v_3(5)$ | $v_4(5)$ | $v_3(7)$ | $v_4(7)$ |

Antenna 2 — 1112

| I branch | $u_5(1)$ | $u_6(1)$ | $u_5(2)$ | $u_6(2)$ | $u_5(3)$ | $u_6(3)$ | $u_5(4)$ | $u_6(4)$ |
|---|---|---|---|---|---|---|---|---|
| Q branch | $v_1(2)$ | $v_2(2)$ | $v_1(4)$ | $v_2(4)$ | $v_1(6)$ | $v_2(6)$ | $v_1(8)$ | $v_2(8)$ |

Antenna 3 — 1114

| I branch | $u_7(1)$ | $u_8(1)$ | $u_7(2)$ | $u_8(2)$ | $u_7(3)$ | $u_8(3)$ | $u_7(4)$ | $u_8(4)$ |
|---|---|---|---|---|---|---|---|---|
| Q branch | $v_3(2)$ | $v_4(2)$ | $v_3(4)$ | $v_4(4)$ | $v_3(6)$ | $v_4(6)$ | $v_3(8)$ | $v_4(8)$ |

Antenna 4 — 1116

Figure 11(c)

METHOD AND SYSTEM FOR DATA TRANSMISSION IN A MULTIPLE INPUT MULTIPLE OUTPUT (MIMO) SYSTEM

PRIORITY CLAIM

The present application is a National Phase entry of PCT Application No. PCT/SG2007/000332, filed Oct. 1, 2007, which claims priority from PCT Application No. PCT/SG2006/000306, filed Oct. 18, 2006, the disclosures of which are hereby incorporated by reference herein in their entirety.

FIELD OF INVENTION

The invention relates broadly to a method for data transmission in a multiple input multiple output (MIMO) system, to a transmitter in a MIMO system, to a computer readable data storage medium having stored thereon computer code means for instructing a MIMO system to execute a method for data transmission in the MIMO system, to a method for processing received data in a MIMO system, to a receiver in a MIMO system and to a computer readable data storage medium having stored thereon computer code means for instructing a MIMO system to execute a method for processing received data in the MIMO system.

BACKGROUND

Wireless communication systems have been used to carry voice traffic and low data rate non-voice traffic. Current wireless communication systems can also carry high data rate multimedia traffic, such as video, data, and other types of traffic. Multimedia Broadcast and Multicast Service (MBMS) channels may be used to transmit streaming applications, such as radio broadcast, television broadcast, movies, and other types of audio or video contents.

The multimedia broadcast multicast service is defined in the Third Generation Partnership Project (3GPP) Release 6 documentation. The standard TS22.146 defines the high level service requirements of the MBMS, and the standard TS22.246 defines typical service scenarios. MBMS services allow user equipment (UE) such as mobile telephones or other mobile terminals to receive services from service providers via a network. MBMS is a packet service (PS) domain service for transferring multimedia data such as audio, pictures, video, etc, to a plurality of terminals using a unidirectional point-to-multipoint bearer service. The services are generally delivered in a packet format, currently in the form of IP Internet protocol (IP) packets. The services are typically provided by the service providers to a radio network controller that controls how the services are delivered to mobile terminals within the network. The radio network controller typically schedules the transmission of services according to network resources and other factors.

As MBMS is a multimedia service, multiple services of different Quality of Service (QoS) or multiple streams of different QoS in a same service may be provided to a single UE or to different UEs. In addition, MBMS transmission mechanisms are typically needed to support variable source data-rates. In other words, source data may vary in transmission rates and bit error rates (BERs).

Since the MBMS channel is unidirectional, a transmitting base station cannot acknowledge any reception error at a UE. Therefore, means of information protection is desirable.

For consideration of information protection, transmission of a modulated information signal over a wireless communication channel requires selection of appropriate methods for protecting the information in the modulated signal. Such methods may comprise, for example, encoding, symbol repetition, interleaving, and other known methods.

For broadcast/multicast services, the characteristics and requirements of the broadcast/multicast services are specified by 3GPP MBMS and the related broadcast/multicast service layer functions. Simultaneous distribution of different content data may be required in a MBMS service and simultaneous reception of more than one MBMS service for one terminal may be required. MBMS transport services may vary, for instance, in QoS parameters. In such cases, unequal error protection mechanisms (UEP) are typically required to support various different QoS for the high data rate communication for MBMS services in wireless systems. In the following description, data with higher quality requirement and/or lower rate requirement are defined as the higher priority data and data with lower quality requirement and/or higher rate requirement are defined as the lower priority data.

Two types of methods have been applied for UEP. One type comprises applying a more powerful conventional error-correcting code to the higher priority data. The other type comprises using non-uniformly spaced modulation constellation or hierarchical modulation to provide unequal protection for the data with different priorities. U.S. Pat. No. 5,105,442 describes coded modulation that may achieve both power-efficiency and bandwidth-efficiency by combining the above two methods.

U.S. Pat. No. 5,214,656 describes combining the coded modulation with a time division multiplexing scheme. Signals with different priorities are separately coded and modulated. The modulated signals with different priorities are then mapped to different time-slots.

The above mentioned methods may provide good performance of unbalanced data transmission but have limited capacity due to their single transmit antenna configuration.

In current technologies, Multiple Input Multiple Output (MIMO) communication systems employ multiple antennas at a transmitter and/or a receiver to improve coverage, quality and capacity. Therefore, one possible way to increase the system capacity of a MBMS system is to use multiple antennas to perform space-time (ST) processing. The concept of combining space-time processing with conventional UEP techniques may be employed to achieve more capacity and better quality.

One method of UEP, described in C. H. Kuo, et al., 'Robust video transmission over wideband wireless channel using space-time coded OFDM system', *WCNC* 2002, vol. 3. March 2002, comprises concatenating forward error correction (FEC) with ST code in MIMO systems. In this method, more robustness is provided to the data with higher priority by adopting more powerful FEC. However, the embedded ST code does not provide differentiation between data with different priorities. Therefore, one problem that may arise is that this kind of concatenation with the unified space-time processing cannot provide further differentiation between data with different priorities and thus, limited protection levels can be supported. Another problem is that it is practically complex to implement this method since for each input data, a space time coder is separately applied.

Yet other methods based on combining different space-time technologies have been proposed for UEP in MIMO systems. See for example, Muhammad Farooq Sabir, Robert W. Heath Jr, and Alan C. Bovik "An unequal error protection scheme for multiple input multiple output systems", *IEEE Asilomar Conference on Signals, Systems and Computers*, vol 1, pp. 575-579, November 2002; and, C. H. Kuo, et al., "Embedded space-time coding for wireless broadcast with heterogeneous receivers", *Globecom* 2000, vol 21, November, 2000. However, since these proposed systems require a change of the coding structure of the space time coder for every different protection requirements and, can only provide specific rates and specific protection levels when the space-time coders are selected, these systems are low in flexibility and are highly complex.

For concatenation codes used in channel coding and space-time coding, turbo codes using an iterative decoding technique are provided as a high-reliable channel coding technique for third generation wireless communication in the International Mobile Telecommunications-2000 (IMT-2000) standard. The turbo codes may perform the coding operation by using parallel concatenated recursive systematic convolutional (RSC) codes and perform the decoding operation using the iterative decoding technique. In addition, the turbo codes represent superior performance approaching the so-called Shannon's limitation with respect to a BER if an interleaver size is made larger and the iterative decoding is sufficiently performed. However, if the turbo codes are employed, one problem that may arise is that the number of operations may increase resulting in high complexity. Another problem that may arise is that as both the size of the interleaver and the number of iterative decoding operations increase, a time delay may occur making a real time process difficult.

Beyond 3G, fourth generation wireless communication systems are being developed in order to provide better voice and high-speed multimedia services. In such systems, a channel coding technique called low density parity check (LDPC) code is being used. The LDPC code has superior coding characteristics as compared to conventional turbo codes, with respect to complexity and performance. The LDPC code is typically a linear block code in which most elements of a parity check matrix (H) are "0". It has been discovered that the LDPC code can provide superior performance if, e.g., a probabilistic coding technique of the LDPC is used.

The LDPC code is defined by a random parity check matrix H in which the number of element "1" in the matrix is sparsely distributed and the rest of the elements are all zeros. The parity check matrix H is typically a matrix for determining if coding is correctly performed with regard to a reception signal. For example, if a value obtained through multiplying a coded reception signal by the parity check matrix H is "0", there is no error in the coding. In the following description, row weight (or row degree) is defined by the number of 1's in a row of the parity check matrix H, and column weight (or column degree) is defined by the number of 1's in a column. Unless otherwise specified, degree refers to column degree in the following description.

The LDPC code may be described by both a matrix and a factor graph. The LDPC code may be decoded in a factor graph using an iterative decoding algorithm based on a sum-product algorithm. The decoder, employing the LDPC code, is less complex than a decoder using turbo code. Furthermore, a parallel processing decoder can be easily embodied. Therefore, a space-time encoder/decoder may have superior channel coding/decoding performance if the space-time encoder/decoder performs coding/decoding operations using the LDPC code.

There are current methods used for UEP by implementing LDPC codes for channel coding. These methods typically map information bits and parity bits to different parts of a codeword by employing a property that different connection degrees of data nodes can provide different error protection. See for example, Xiumei Yang, et. al, "New research on unequal error protection (UEP) property of Irregular LDPC codes", Consumer Communications and Networking Conference, 2004. First IEEE 5-8 Jan. 2004 Page(s):361-363, and Poulliat C., Declercq D., Fijalkow I., Optimization of LDPC codes for UEP channels, in Proc. IEEE International Symposium on Information Theory (ISIT'04), p. 450, Chicago, Ill., USA, June 2004. For such methods, application of the LDPC codes is typically restricted because construction of the parity check matrix structure is practically difficult. Further, the performance diversity achieved for different level bits is typically low since different code rates cannot be realized for different information bits.

Further, "New results on unequal error protection using LDPC codes", IEEE Communication letters, vol. 10, no. 1, January 2006 describes yet another LDPC-based method that relates to combining two Tanner graphs. However, there is no further explanation in the document on how to construct a sub-block to generate a usable parity check matrix.

In view of the above, transmission techniques that may simultaneously support various error protection requirements in high rate data transmission, e.g. MBMS services, at high system flexibility and low implementation complexity are desired.

Hence, there exists a need for a method and system for data transmission in a multiple input multiple output (MIMO) system to address at least one of the above problems.

SUMMARY

In accordance with a first aspect of the present invention, there is provided a method for data transmission in a multiple input multiple output (MIMO) system, the method comprising receiving multiple input data streams; performing low density parity check (LDPC) encoding of the input data streams utilising a parity check matrix, wherein the parity check matrix comprises a plurality of sub-parity check matrices for encoding respective associated ones of the input data streams and performing space time encoding for transmitting the LDPC encoded input data streams over a plurality of antennas; wherein the performing of the LDPC encoding of the input data streams comprises generating one or more connection matrices, each connection matrix for injecting information of one of the input data streams into the encoding of another one of the input data streams, and wherein said each connection matrix is a zero matrix if a lowest parity check protection level based on the sub-parity check matrix for said one of the input data streams is equal to or lower than an assigned parity check protection level for said one input data stream, and a non zero matrix otherwise.

The multiple input data streams may comprise M input streams of M different classes, and the parity check matrix may have M layers, each layer of the parity check matrix corresponding to one of the M classes.

Each connection matrix may link two of the M layers such that the correlation information between the two layers is injected during the LDPC encoding.

For each connection matrix, if the assigned parity check protection level is k levels higher than the lowest parity check protection level, said each connection matrix may be generated using the steps of providing a matrix $$C^{(k)} = \left[ I_m^{(2(k-1))} | I_m^{(2(k-1)+1)} | \ldots | I_m^{\left(2(k-1)+\lfloor \frac{l}{m} \rfloor\right)} \right],$$

where $m=r_i$, $l=n_i$, $r_i$ is a number of parity check bits of said one of the input data streams and $n_i$ is a codeword length of said one of the input data streams and $I_m^{(t)}$ is a t-column left shift operation of an identity matrix $I_m$; denoting $C_k=C^{(k)}[:,1:l]$; denoting $C'_{i,j}=C_1+C_2+\ldots+C_k$ and downshifting $C'_{i,j}$ by $(i-1)$ rows to obtain said each connection matrix.

The parity check matrix may be a block-wise low triangular matrix, with the sub-parity check matrices located as blocks along a main diagonal of the parity check matrix.

The connection matrices may be located as blocks below the main diagonal of the parity check matrix, with blocks above the main diagonal being zero matrices.

In accordance with a second aspect of the present invention, there is provided a transmitter in a multiple input multiple output (MIMO) system, the transmitter comprising one or more input units for receiving multiple input data streams; a low density parity check (LDPC) encoder; a spatial mapping unit; wherein the LDPC encoder performs LDPC encoding of the input data streams utilising a parity check matrix and the parity check matrix comprises a plurality of sub-parity check matrices for encoding respective associated ones of the input data streams and the spatial mapping unit performs space time encoding for transmitting the LDPC encoded input data streams over a plurality of antennas; wherein for the performing of the LDPC encoding of the input data streams, the LDPC encoder generates one or more connection matrices, each connection matrix for injecting information of one of the input data streams into the encoding of another one of the input data streams, and wherein said each connection matrix is a zero matrix if a lowest parity check protection level based on the sub-parity check matrix for said one of the input data streams is equal to or lower than an assigned parity check protection level for said one input data stream, and a non zero matrix otherwise.

The multiple input data streams may comprise M input streams of M different classes, and the parity check matrix may have M layers, each layer of the parity check matrix corresponding to one of the M classes.

Each connection matrix may link two of the M layers such that the correlation information between the two layers is included during the LDPC encoding.

For each connection matrix, if the assigned parity check protection level is assigned to be k levels higher than the lowest parity check protection level, the LDPC encoder may generate said each connection matrix using the steps of providing a matrix $$C^{(k)} = \left[ I_m^{(2(k-1))} | I_m^{(2(k-1)+1)} | \ldots | I_m^{\left(2(k-1)+\lfloor \frac{l}{m} \rfloor\right)} \right],$$

where $m=r_i$, $l=n_i$, $r_i$ is a number of parity check bits of said one of the input data streams and $n_i$ is a codeword length of said one of the input data streams and $I_m^{(t)}$ is a t-column left shift operation of an identity matrix $I_m$; denoting $C_k=C^{(k)}[:,1:l]$; denoting $C_{i,j}*=C_1+C_2+\ldots+C_k$; and downshifting $C'_{i,j}$ by $(i-1)$ rows to obtain said each connection matrix.

The parity check matrix may be a block-wise low triangular matrix, with the sub-parity check matrices located as blocks along a main diagonal of the parity check matrix.

The connection matrices may be located as blocks below the main diagonal of the parity check matrix, with blocks above the main diagonal being zero matrices.

In accordance with a third aspect of the present invention, there is provided a computer readable data storage medium having stored thereon computer code means for instructing a multiple input multiple output (MIMO) system to execute a method for data transmission in the MIMO system, the method comprising receiving multiple input data streams; performing low density parity check (LDPC) encoding of the input data streams utilising a parity check matrix, wherein the parity check matrix comprises a plurality of sub-parity check matrices for encoding respective associated ones of the input data streams and performing space time encoding for transmitting the LDPC encoded input data streams over a plurality of antennas; wherein the performing of the LDPC encoding of the input data streams comprises generating one or more connection matrices, each connection matrix for injecting information of one of the input data streams into the encoding of another one of the input data streams, and wherein said each connection matrix is a zero matrix if a lowest parity check protection level based on the sub-parity check matrix for said one of the input data streams is equal to or lower than an assigned parity check protection level for said one input data stream, and a non zero matrix otherwise.

In accordance with a fourth aspect of the present invention, there is provided a method for processing received data streams in a multiple input multiple output (MIMO) system, the method comprising receiving data streams via a plurality of receive antennas; performing space time decoding on the received data streams; and performing low density parity check (LDPC) decoding of the received data streams utilising a parity check matrix for decoding the data streams, wherein the parity check matrix comprises a plurality of sub-parity check matrices for decoding respective associated ones of the received data streams; wherein the performing of the LDPC decoding of the received data streams comprises using one or more connection matrices, each connection matrix for providing information of one of the received data streams for decoding of another one of the received data streams, and wherein said each connection matrix is a zero matrix if a lowest parity check protection level based on the sub-parity check matrix for said one of the input data streams is equal to or lower than an assigned parity check protection level for said one input data stream, and a non zero matrix otherwise.

The method may further comprise using a sum-product method for decoding the received data streams.

In accordance with a fifth aspect of the present invention, there is provided a receiver in a multiple input multiple output (MIMO) system, the receiver comprising a plurality of receive antennas for receiving data streams; a spatial mapping decoder for performing space time decoding on the received data streams; and a low density parity check (LDPC) decoder for decoding the received data streams utilising a parity check matrix for decoding the data streams, wherein the parity check matrix comprises a plurality of sub-parity check matrices for decoding respective associated ones of the received data streams; wherein for the performing of the LDPC decoding of the received data streams, the LDPC decoder uses one or more connection matrices, each connection matrix for providing information of one of the received data streams for decoding of another one of the received data streams, and wherein said each connection matrix is a zero matrix if a lowest parity check protection level based on the sub-parity check matrix for said one of the input data streams is equal to or lower than an assigned parity check protection level for said one input data stream, and a non zero matrix otherwise.

The LDPC decoder may comprise one or more sum-product decoders.

In accordance with a sixth aspect of the present invention, there is provided a computer readable data storage medium having stored thereon computer code means for instructing a multiple input multiple output (MIMO) system to execute a method for processing received data streams in the MIMO system, the method comprising receiving data streams via a plurality of receive antennas; performing space time decoding on the received data streams; and performing low density parity check (LDPC) decoding of the received data streams utilising a parity check matrix for decoding the data streams, wherein the parity check matrix comprises a plurality of sub-parity check matrices for decoding respective associated ones of the received data streams; wherein the performing of the LDPC decoding of the received data streams comprises using one or more connection matrices, each connection matrix for providing information of one of the received data streams for decoding of another one of the received data streams, and wherein said each connection matrix is a zero matrix if a lowest parity check protection level based on the sub-parity check matrix for said one of the input data streams is equal to or lower than an assigned parity check protection level for said one input data stream, and a non zero matrix otherwise.

BRIEF DESCRIPTION OF THE DRAWINGS

Embodiments of the invention will be better understood and readily apparent to one of ordinary skill in the art from the following written description, by way of example only, and in conjunction with the drawings, in which:

FIG. 8(a) is an example parity check matrix of the LDPC code of FIG. 7.

FIG. 8(b) is another example parity check matrix of the LDPC code of FIG. 7.

FIGS. 11(a) to 11(c) are I-branch/Q-branch tables for illustrating examples of logical signal mapping and combining of systematic/information and parity data.

DETAILED DESCRIPTION

Figure 1:
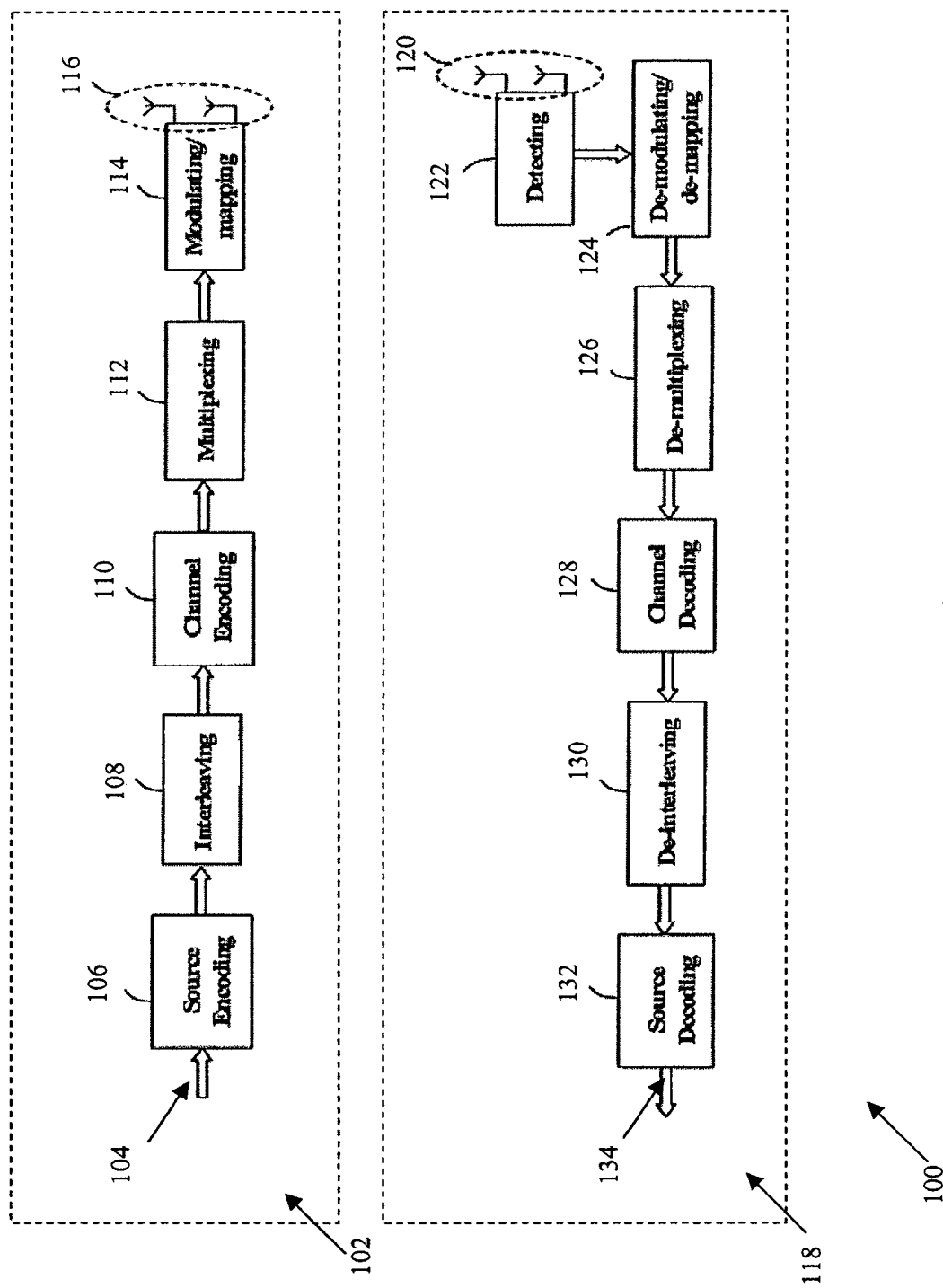
FIG. 1 is a schematic block diagram broadly illustrating a wireless communication system in an example implementation.

Some portions of the description which follows are explicitly or implicitly presented in terms of algorithms and functional or symbolic representations of operations on data within a computer memory. These algorithmic descriptions and functional or symbolic representations are the means used by those skilled in the data processing arts to convey most effectively the substance of their work to others skilled in the art. An algorithm is here, and generally, conceived to be a self-consistent sequence of steps leading to a desired result. The steps are those requiring physical manipulations of physical quantities, such as electrical, magnetic or optical signals capable of being stored, transferred, combined, compared, and otherwise manipulated.

Unless specifically stated otherwise, and as apparent from the following, it will be appreciated that throughout the present specification, discussions utilizing terms such as "scanning", "calculating", "determining", "replacing", "generating", "initializing", "outputting", or the like, refer to the action and processes of a computing system, or similar electronic device, that manipulates and transforms data represented as physical quantities within the computing system into other data similarly represented as physical quantities within the computing system or other information storage, transmission or display devices.

The present specification also discloses an apparatus for performing the operations of the methods. Such apparatus may be specially constructed for the required purposes, or may comprise a general purpose computer or other devices selectively activated or reconfigured by a computer program stored in the computer. The algorithms presented herein are not inherently related to any particular computer or other apparatus. Various general purpose machines may be used with programs in accordance with the teachings herein. Alternatively, the construction of more specialized apparatus to perform the required method steps may be appropriate.

In addition, the present specification also implicitly discloses a computer program, in that it would be apparent to the person skilled in the art that the individual steps of the method described herein may be put into effect by computer code. The computer program is not intended to be limited to any particular programming language and implementation thereof. It will be appreciated that a variety of programming languages and coding thereof may be used to implement the teachings of the disclosure contained herein. Moreover, the computer program is not intended to be limited to any particular control flow. There are many other variants of the computer program, which can use different control flows without departing from the spirit or scope of the invention.

Furthermore, one or more of the steps of the computer program may be performed in parallel rather than sequentially. Such a computer program may be stored on any computer readable medium. The computer program when loaded and executed on a general-purpose computer effectively results in an apparatus that implements the steps of the preferred method.

To establish a MBMS service, typically, a core network CN transmits a MBMS context establishment request labelled REQ to a radio network controller RNC1 and the radio network controller RNC1 returns a MBMS context establishment response labelled RESP. The request typically includes MBMS parameters QoS. The radio network controller RNC1 then establishes the MBMS context within the RNC for the respective MBMS service. The RNC may establish a MBMS data bearer with the CN before the notification phase or after the notification phase. The RNC typically determines how the MBMS service is supplied across the network, and in particular whether the service is delivered from a single cell or multiple cells.

Figure 14:
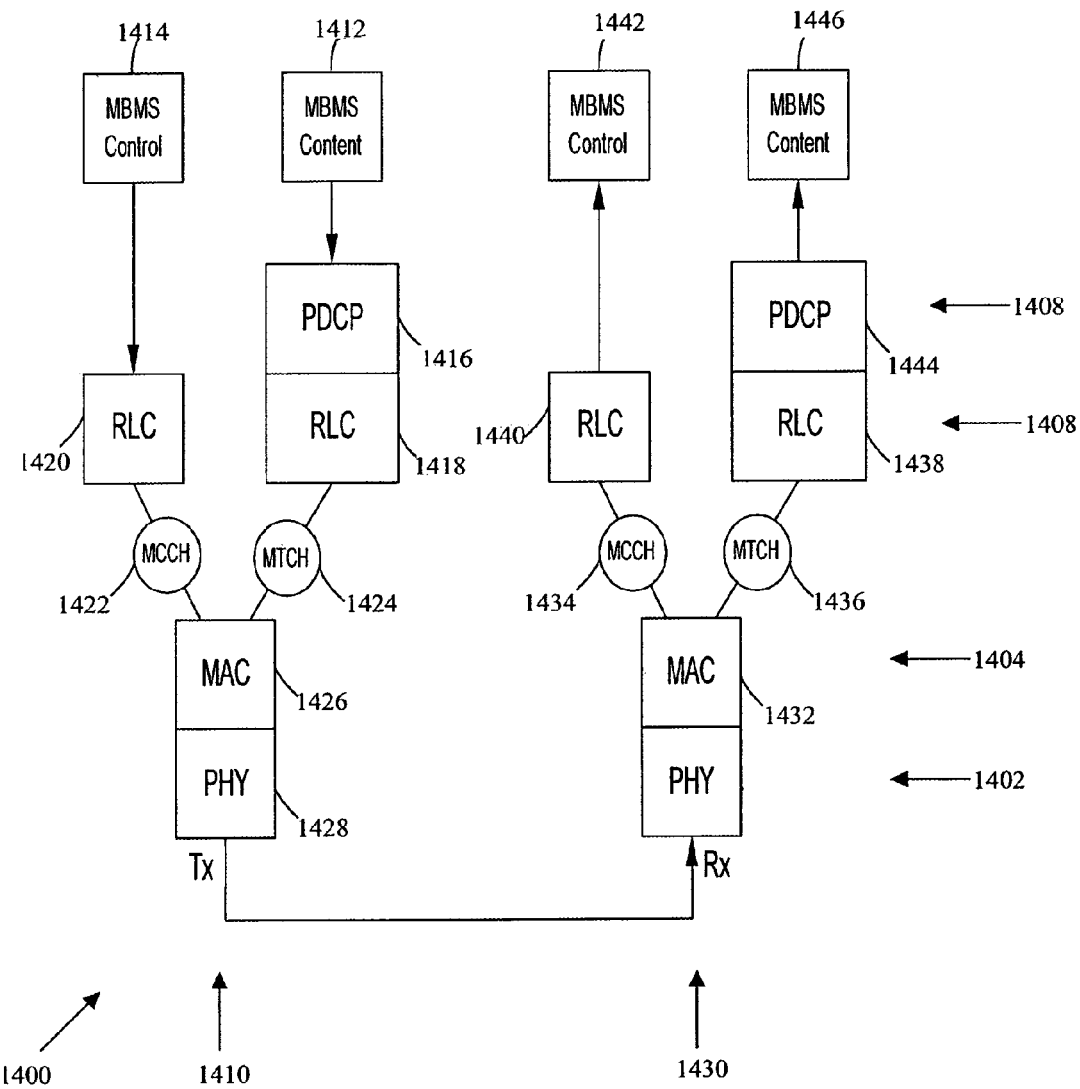
FIG. 14 is a schematic diagram illustrating a protocol architecture implementing Multimedia Broadcast and Multicast Service (MBMS) services.

FIG. 14 is a schematic diagram illustrating a protocol architecture 1400 implementing Multimedia Broadcast and Multicast Service (MBMS) services. A protocol stack according to 3GPP typically comprises a plurality of layers, beginning at a physical layer PHY 1402 which represents the signalling link, a medium access control (MAC) protocol layer 1404, a radio link control (RLC) protocol layer 1406 and a packet data convergence protocol (PDCP) layer 1408. The 3GPP protocol stack may include a number of other layers and typically, only the above layers are used for delivery of MBMS services.

The PDCP layer 1408 exists in a user plane for services from the PS domain. Services offered by the PDCP can be called radio bearers and PDCP provides the header compression services. PDCP compresses redundant protocol information at a transmitting entity and decompresses at a receiving entity. PDCP also transfers user data that is received in the form of PDCP Service Data Units (SDUs) from the non-access stratum and forwards them to the RLC entity, and vice versa.

The RLC layer 1406 performs framing functions to user and control data, that include segmentation/concatenation and padding functionalities. The RLC layer 1406 typically provides segmentation and retransmission services to a Radio Resource Control (RRC) layer for control data in the control plane and to the application layer for user data in the user plane. The RLC layer 1406 typically performs segmentation/reassembly of variable length higher layer Protocol Data Units (PDUs) into/from smaller RLC PDUs.

Each RLC instance in the RLC layer 1406 can be configured by the RRC layer to operate in one of three modes: a transparent mode (TM), an unacknowledged mode (UM), and an acknowledged mode (AM). The three data transfer modes indicate the mode in which the RLC is configured for a logical channel. The transparent and unacknowledged mode RLC entities are defined to be unidirectional whereas the acknowledged mode entities are bi-directional.

The MAC layer 1404 offers services to the RLC layer 1406 by means of logical channels that are characterized by the type of data transmitted. The MAC layer 1404 maps and multiplexes logical channels to transport channels. The MAC layer 1404 identifies the User Equipments (UEs) that are on common channels. The MAC layer 1404 also multiplexes/demultiplexes higher layer PDUs into/from transport blocks delivered to/from the physical layer 1402 on common transport channels. The MAC handles service multiplexing for common transport channels since it typically cannot be done in the physical layer 1402. When a common transport channel carries data from dedicated type logical channels, an associated MAC header includes an identification of the UE. The MAC layer 1404 also multiplexes and demultiplexes higher layer PDUs into/from transport block sets delivered to or from the physical layer 1402 on dedicated transport channels.

The physical layer 1402 couples to the MAC layer 1404 via transport channels that carry signalling information and user data. The physical layer 1402 offers services to the MAC layer 1404 via transport channels that can be characterized by how and with what characteristic data is transferred. The physical layer 1402 receives signalling and user data over the radio link via physical channels. The physical layer 1402 typically performs multiplexing and channel coding including Cyclic Redundancy Check (CRC) calculation, forward-error correction (FEC), rate matching, interleaving transport channel data, and multiplexing transport channel data, as well as other physical layer procedures such as acquisition, access, page, and radio link establishment/failure. The physical layer 1402 may also be responsible for spreading and scrambling, modulation, measurements, transmit diversity, power weighting, handover, compressed mode and power control.

A Common Traffic Channel (CTCH) is a unidirectional channel existing in the downlink direction and can be used when transmitting information either to all terminals or a specific group of terminals. Data transfer modes typically use unidirectional common channels that do not have a reverse-link channel set up.

On the left hand side of FIG. 14, application of the above layers are shown in a controlling RNC 1410. That is, the RNC 1410 receives MBMS content 1412 together with MBMS control signals 1414. The MBMS content 1412 is processed in the PDCP layer 1416. The packetised data is delivered to a data plane 1418 of the RLC layer 1406 and the control signals are delivered respectively to a control plane 1420 of the RLC layer 1406. At the RLC layer 1406, RLC PDUs are constructed. To support MBMS data and control, the MAC layer 1404 provides MBMS control channels MCCH 1422 and MBMS traffic channels MTCH 1424 for a base station which delivers the service. The MBMS service is mapped and multiplexed from logical channels to transport channels in the MAC layer 1426. The MAC layer 1404 communicates with the physical layer 1428 for providing transmission units to deliver the MBMS services to a mobile terminal UE 1430.

The right hand side of FIG. 14 illustrates equivalent protocol layers at the mobile terminal UE 1430. It is considered in this context that Tx represents the transmission side of the physical link between the base station and the mobile terminal UE 1430 while Rx represents the received side of channels at the mobile terminal UE 1430. The mobile terminal UE 1430 implements MAC entities 1432 and provides MBMS control channels 1434 and MBMS traffic channels 1436 similar to those for the controlling RNC 1410. The RLC layer 1438 deals with combining the packets which have been delivered by MAC entities. The RLC layer 1440 separates out the control functionality at numeral 1442. As a final step, the PDCP layer 1444 delivers the MBMS content 1446 to a user.

An example implementation may provide techniques for signal processing in a physical layer of a 3GPP protocol stack to support simultaneous transmission of multiple content data with different BERs. The example implementation may be implemented in any suitably arranged wireless MIMO system. The wireless communication of the MIMO system may conform to any communications standards.

FIG. 1 is a schematic block diagram broadly illustrating a wireless communication system 100 in the example implementation. At a transmitter 102, source data (at numeral 104) are encoded by source encoder units 106 and interleaved by interleavers 108 to generate information data for transmission. The information data are sent, e.g. in blocks, to channel encoding units 110 to perform channel coding and rate matching. The coded data are sent to multiplexing units 112 to multiplex the data into a plurality of data streams. The multiplexed data streams are sent to modulating and mapping units 114 to generate modulated data streams. The modulated data streams are then transmitted by a plurality of transmit antennas 116 to a receiver 118.

At the receiver 118, the transmitted signals are received by a plurality of receive antennas 120 and sent to a detecting unit 122 that detects and separates the received signals into a plurality of detected data streams. The detected data streams are sent to demodulating and demapping units 124 for demodulation and demapping to generate demodulated data streams. The demodulated data streams are sent to de-multiplexing units 126 to de-multiplex the data into a plurality of demultiplexed data streams. The demultiplexed data streams are sent into channel decoding units 128 to recreate the information data. The recreated information data are then de-interleaved by deinterleaving units 130 and sent to source decoder units 132 to recover the transmitted source data (at numeral 134).

Figure 2:
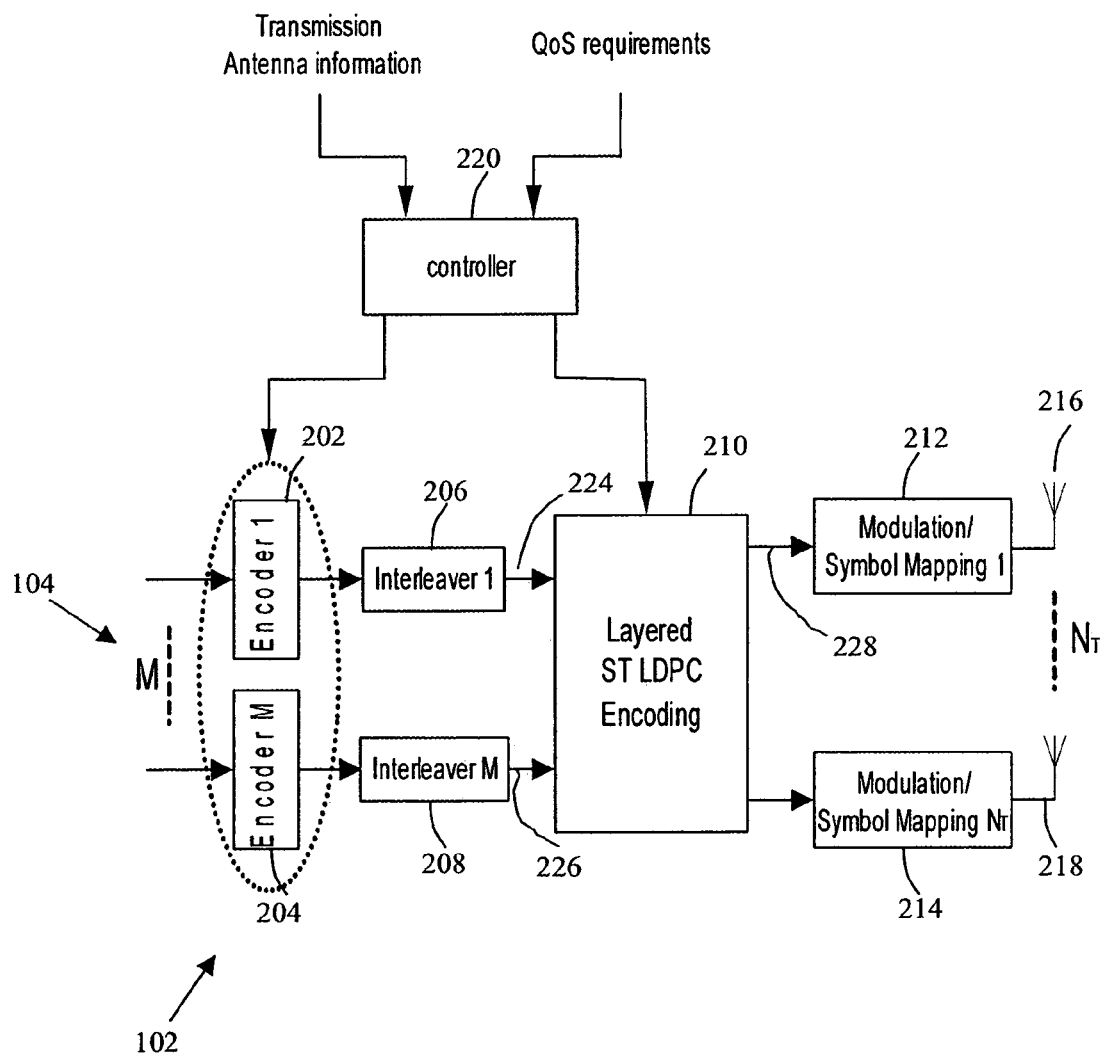
FIG. 2 is a schematic block diagram illustrating a transmitter.

FIG. 2 is a schematic block diagram illustrating the transmitter 102. In the example implementation, the transmitter 102 employs source/channel coding schemes with various space-time processing techniques to provide unequal error protection for different content data. The input data (received at one or more input members at numeral 104), e.g. corresponding to MBMS services, are classified into different classes, namely higher priority input data and lower priority input data, based on e.g. requirement of quality and/or data rate. For example, services or data that require low BERs are denoted as higher priority services or data while on the other hand, services or data that can tolerate high BERs are denoted as lower priority services or data.

Classes may also be based on, but not limited to, data transmission rates, quality of service (QoS) requirements, the number of transmission antennas and transmission conditions.

The M input data streams (received at one or more input units at numeral 104) with different priority are encoded by M source encoders 202, 204. The input streams may either be encoded using a unified coding scheme or different coding schemes. The source encoders 202, 204 may be different or the same as any encoder known to a person skilled in the art. Outputs of the M source encoders 202, 204 are sent to M interleaver units 206, 208 to be interleaved. The interleaver units 206, 208 may be the same or different.

Interleaved data from the interleaver units 206, 208 are input into a layer ST LDPC encoding unit 210. The layer ST LDPC encoding unit 210 encodes the different priority data with different code rates and/or different codeword lengths and maps the encoded data into a plurality ($N_T$) of transmit antenna streams. The data distributed to the $N_T$ transmit antenna streams are modulated/symbol mapped using $N_T$ modulation/symbol mapper unit 212, 214 before the data are sent to $N_T$ transmit antennas 216, 218. The modulation/symbol mapper units 212, 214 perform symbol mapping with respect to the data using various modulation schemes. The output data of the modulation/symbol mapper units 212, 214 are transmitted from the transmitter 102 using the $N_T$ transmit antennas 216, 218.

Based on the above, the example implementation encodes the M classes of information data with different priorities by using a layered LDPC channel coding code that comprises M layers. The channel coding code encodes each layer with a different code rate and/or codeword length according to desired protection requirements. The channel coding code then combines and maps systematic/information data and parity data from the M layers of encoded data to a plurality of transmission antennas with different diversity gain in the space, time and/or frequency domain.

To adapt to different BER requirements and the number of available transmission antennas for transmission, the selection of source encoders 202, 204 and the design of the layer ST LDPC encoding unit 210 can change accordingly to achieve the desired BER and/or capacity. Therefore, a controller 220 is provided to control the design of both the layer LDPC coding and spatial mapping according to input QoS requirements and transmission antenna information.

Thus, the transmitter 102 receives multiple input data sequences or streams with each data stream assigned with a priority level or class. The priority level for each data stream is pre-determined based on service quality requirements. The transmitter 102 segments the input data streams into a plurality of layers and the controller 220 of the transmitter 102 assigns each layer with an error protection level. A code rate, codeword length and a lowest acceptable error protection level for each layer are determined as parameters and a parity check matrix is generated using the determined parameters. The input data are then encoded using the generated parity check matrix.

Figure 3:
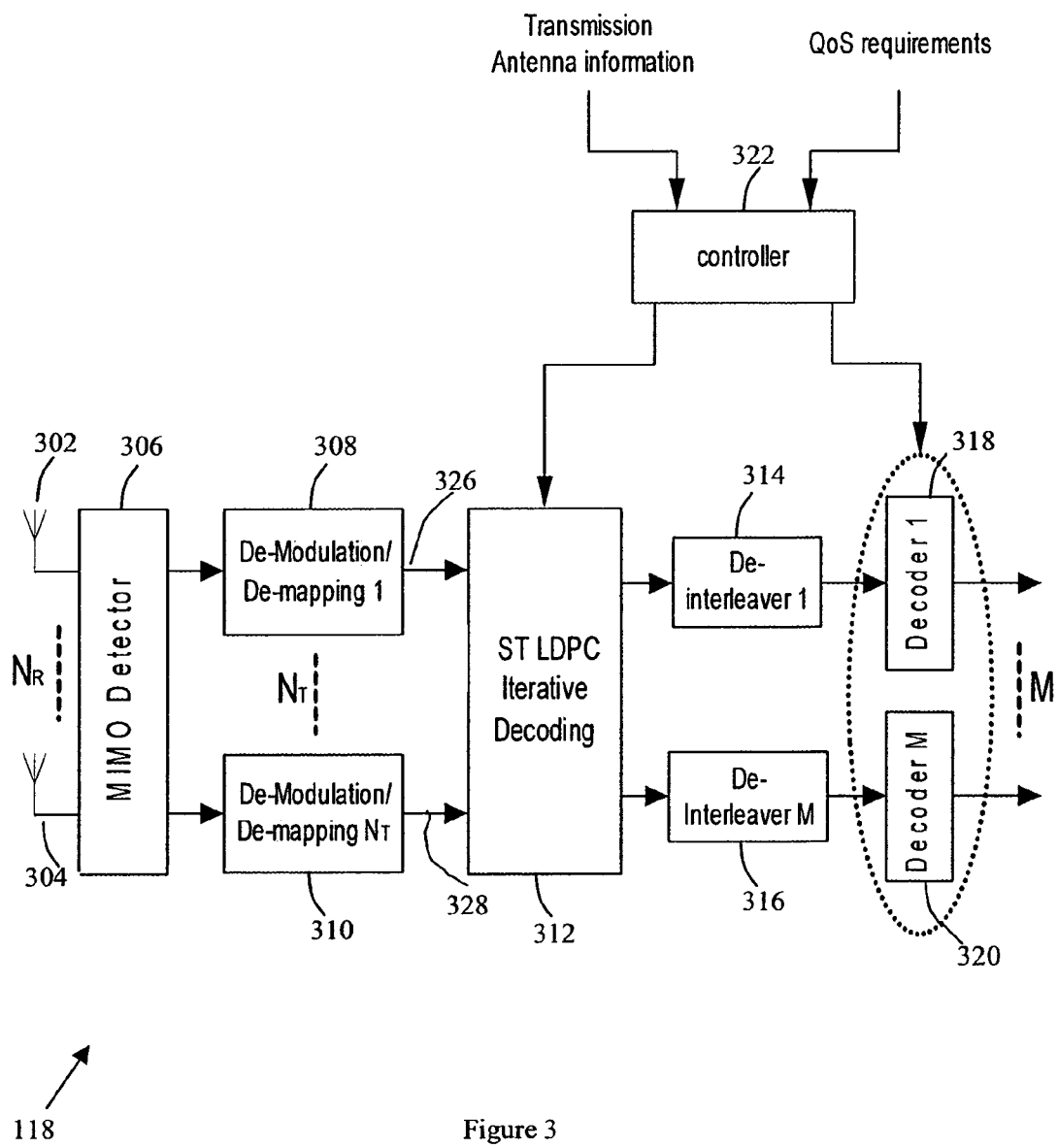
FIG. 3 is a schematic block diagram illustrating a receiver.

FIG. 3 is a schematic block diagram illustrating the receiver 118. At the receiver 118, multiple data sequences or signals received at a plurality of ($N_R$) receiver antennas 302, 304 are first combined and then applied to a MIMO detector 306 to recover the signals transmitted from the transmitter 102 (FIG. 2). The MIMO detector 306 can be operated in a number of ways known to a person skilled in the art. An example is to use a linear estimator matrix constructed by using the channel information to effectively separate the plurality of transmitted signals arriving at the receiver antennas 302, 304. Another example is to use optimal techniques based on maximum likelihood (ML) or maximum a posteriori (MAP) algorithms. In addition, minimum mean square error (MMSE) and decision-feedback detection methods may be used for the MIMO detector 306 to reduce system complexity.

The signals transmitted by the transmitter antennas 216, 218 (FIG. 2) are detected and split into $N_T$ branches by the MIMO detector 306. Demapping and demodulation operations are performed on the split signals in each branch using respective demodulation/demapping units 308, 310. After demapping and demodulation, the demodulated signals of the $N_T$ branches are sent to a ST LDPC iterative decoding unit 312 to recreate the M layers signals that correspond to the M classes of source encoded and interleaved data transmitted from the transmitter 102 (compare layer ST LDPC encoding unit 210).

The M channel decoded data streams are output from the ST LDPC iterative decoding unit 312 and deinterleaved using deinterleaver units 314, 316. The selection of the deinterleaver units 314, 316 is dependent on the interleaver units 206, 208 (FIG. 2) used at the transmitter 102 (FIG. 2). The deinterleaved data are sent to source decoder units 318, 320 to recreate the M classes of source data. The types of the decoder units 318, 320 are dependent on the source encoder units 202, 204 (FIG. 2) used at the transmitter 102 (FIG. 2).

In the receiver 118, a controller unit 322 is provided to perform source decoding and ST layered LDPC decoding according to desired QoS requirements and transmission antennas information (compare the controller 220 of the transmitter 102).

Figure 4:
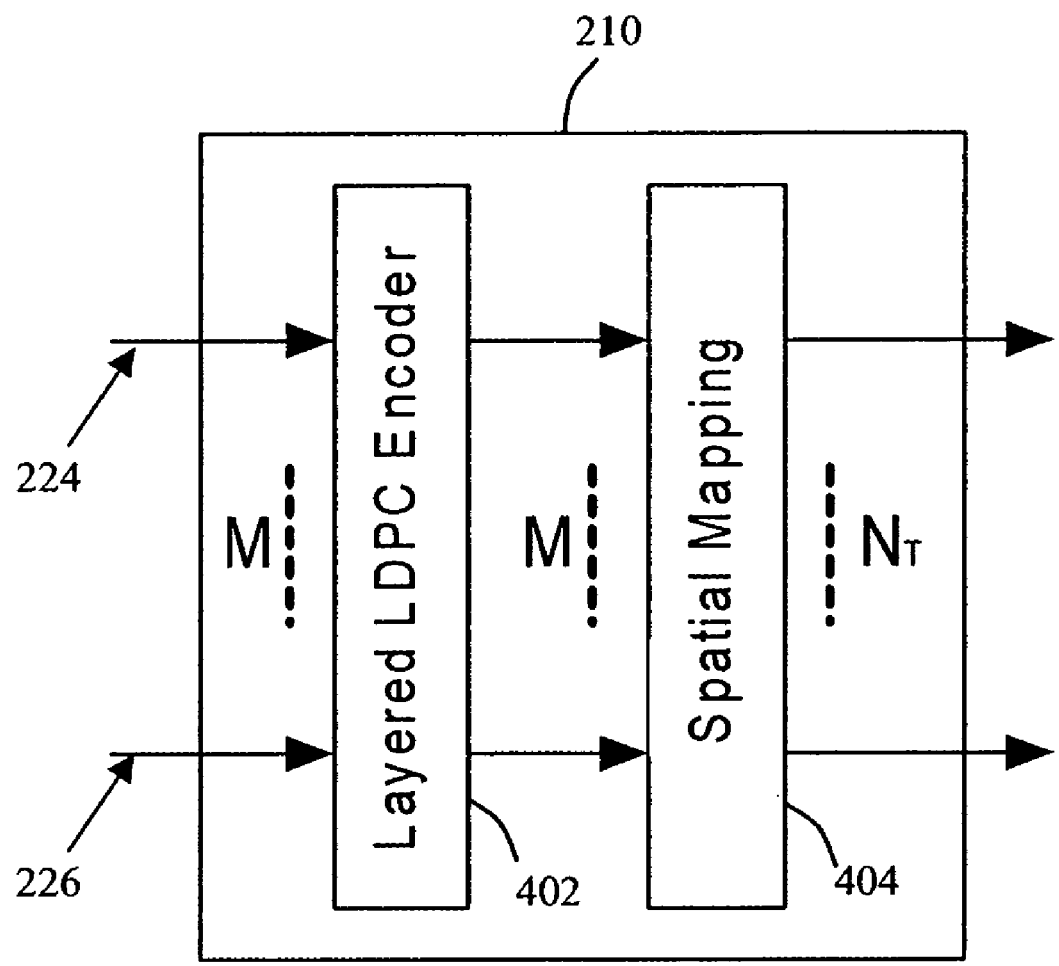
FIG. 4 is a block diagram illustrating a layer space-time (ST) low density parity check (LDPC) encoder unit.

FIG. 4 is a block diagram illustrating the layer ST LDPC encoding unit 210. The layer ST LDPC encoding unit 210 comprises a layered LDPC encoder 402 and a spatial mapping unit 404. The input data (e.g. at numerals 224, 226) are first encoded by the layered LDPC encoder 402. The layered LDPC encoder 402 comprises M designed layers and each layer is used for encoding each class of input data with a different code rate and different codeword length. After encoding, the M encoded data are sent to the spatial mapping unit 404. The spatial mapping unit 404 performs multiplexing and/or demultiplexing operations on the M data streams and then maps them into a plurality of transmit antenna streams according to a designed mapping scheme.

Figure 5:
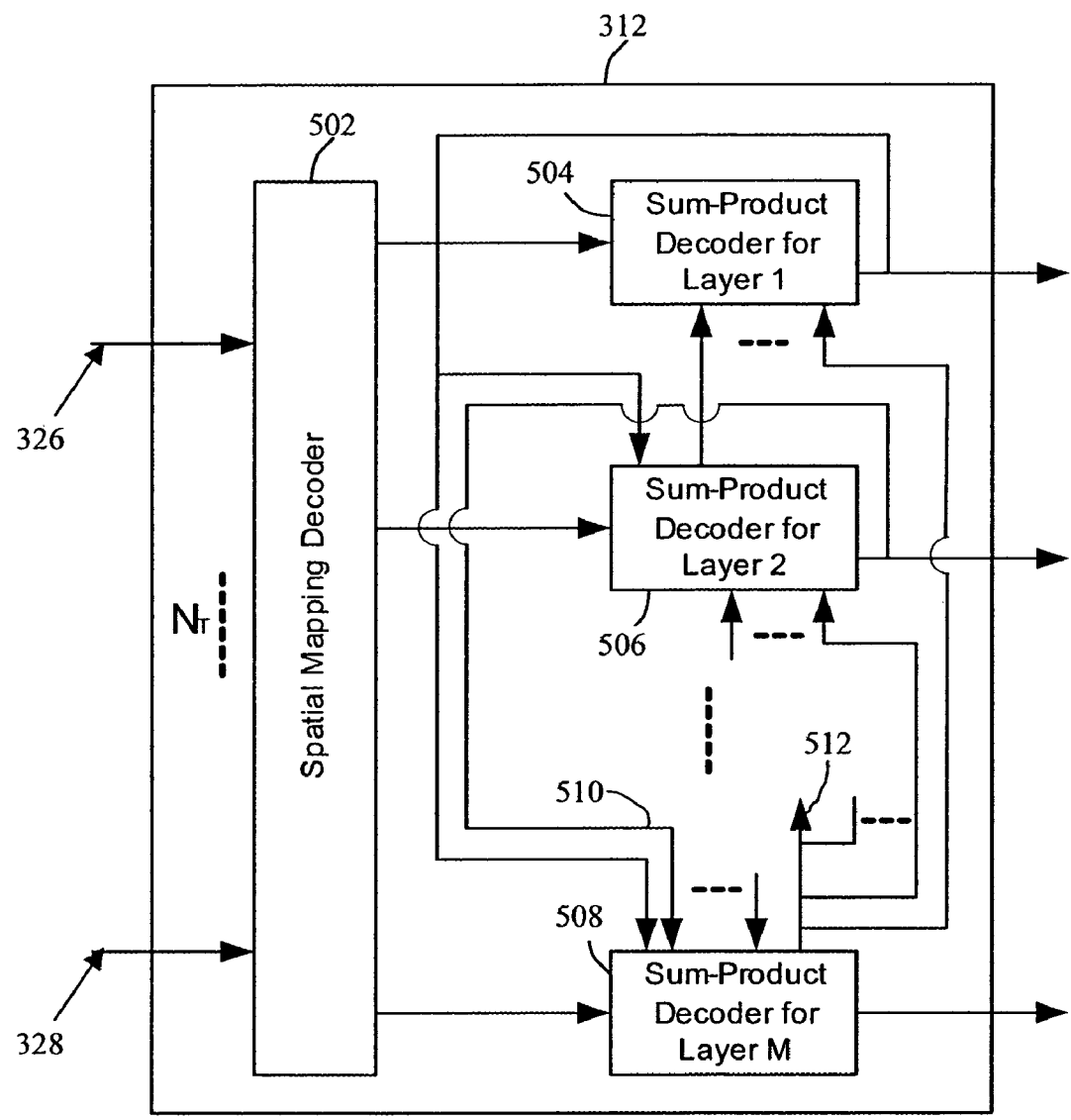
FIG. 5 is a block diagram illustrating a ST LDPC iterative decoding unit.

FIG. 5 is a block diagram illustrating the ST LDPC iterative decoding unit 312. The ST LDPC iterative decoding unit 312 receives $N_T$ input demodulated signals (e.g. at numerals 326, 328) and performs decoding operations based on the encoding performed by the layered ST LDPC encoder unit 210 (FIG. 4) to output recreated M classes of transmitted data. The ST LDPC iterative decoding unit 312 comprises a spatial mapping decoder 502 and a LDPC decoder in the form of M sum-product decoders 504, 506, 508 for M layers. The input $N_T$ data streams (e.g., at numerals 326, 328) are input to the spatial mapping decoder 502 which performs an inverse of the operations of the spatial mapping unit 404 (FIG. 4). Therefore, the $N_T$ data streams are demultiplexed and/or multiplexed to obtain M data streams corresponding to the designed mapping scheme used with reference to FIG. 4.

The decoded M streams are output from the spatial mapping decoder 502 and input to the M sum-product decoders 504, 506, 508 such that each sum-product decoder 506 decodes an input data stream with the information from the preceding sum-product decoder 504. In other words, an i th sum-product decoder receives an i th input data stream and the information from the results of the first to the (i−1)th sum-product decoders. Based on the information, the i th sum-product decoder then performs iterative sum-product decoding to recreate an i th layer data that corresponds to an i th class of data with i th priority. In the example implementation, the order of decoding corresponds to the order of encoding carried out in the layer ST LDPC encoding unit 210 (FIG. 4).

The example implementation described above may provide unequal error protection to different data with different priorities. In the following description, more details of the layered ST LDPC encoding, decoding and spatial mapping techniques are provided.

Figure 6:
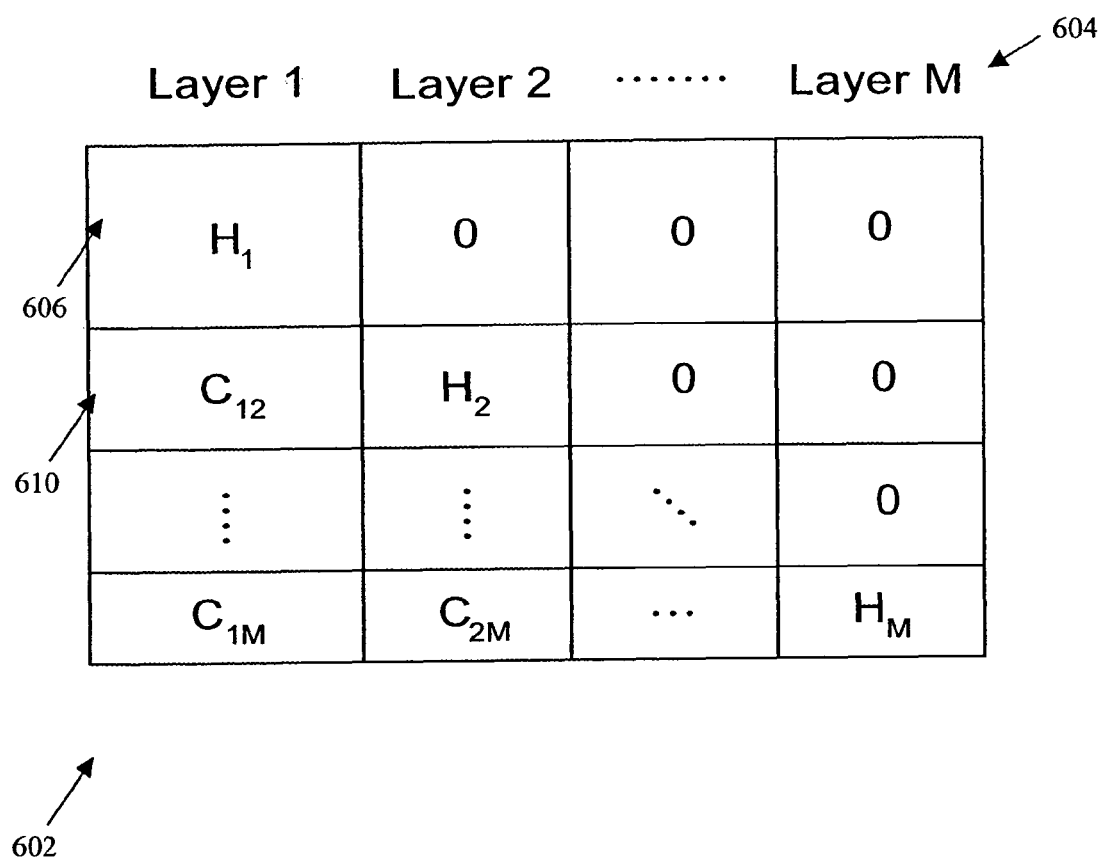
FIG. 6 illustrates a layered structure of a parity check matrix of a LDPC code used in an encoder.

FIG. 6 illustrates a layered structure of a parity check matrix 602 of the LDPC code used in the encoder 402 (FIG. 4). The LDPC code may be represented by the low density parity check matrix H 602. The low density parity check matrix H 602 is designed as a block-wise low triangular matrix. The matrix H 602 can be divided into layers (see numeral 604) to implement layer coding for each layer data with different quality and/or rate requirements e.g., different code rates, different codeword lengths and/or different check degrees.

As illustrated in FIG. 6, the parity check matrix H 602 is constructed with M layers. For each i th layer, there is provided a sub-matrix H 606 which can be a sub parity check matrix that performs sub-coding for each i th layer information. The sub-matrixes are disposed diagonally in the parity check matrix H 602. There is also provided consecutive blocks $C_{i,j}$ (j=i+1, ... M) 610 which are correlated to other layers. The blocks $C_{i,j}$ disposed off-diagonal in the parity check matrix H 602. A valid binary codeword b satisfies $Hb^T=0$. For each different layer, the corresponding sub matrix $H_i$ can have a different number of rows and columns from other sub-matrices. Therefore, the codeword b is also constructed with M layers. Each layer of the codeword b can have a different length of codeword and the code rates may be different for different layers. In the example implementation, a matrix $C_{i,j}$ represents correlated information to link layers i and j.

Based on the property of LDPC codes, bits (or variable nodes) of the codeword b with higher degrees are better protected. In the example implementation, the connection matrices $C_{i,j}$ (j=i+1, ..., M) may be regarded as elements that add degrees to the bits in the i th layer such that the bits mapped to the i th layer may be provided with better error protection as compared to the bits mapped to the (i+1)th layer. Therefore, layers from high to low (i.e., corresponding to mapped bits from high priority to low priority) are arranged from left to right in the parity check matrix H 602. In addition, the data nodes of higher layer data may have higher connection degrees due to the quasi low triangular structure of the parity check matrix H 602.

In the example implementation, the bits from M classes are mapped to (i.e., encoded by) M layers respectively and the order of the priorities (from highest to lowest) are the same as the order of layers (i.e., from Layer 1 to Layer M) so as to employ the unequal error protection property of the described layered LDPC code. On the other hand, the code rates resulting from each sub parity check matrix H are increasing according to the order of layers such that different bits of different priority (e.g., from highest to lowest) are encoded with different code rates (e.g., from lowest to highest) and thus, may achieve different error protection levels (e.g., from highest to lowest). The codeword length for each layer may be adjusted according to various error probability and/or transmission rate requirements.

Assume that the codeword length of an i th layer is $n_i$ and the number of parity check bits is $r_i$. That is, the sub parity-check matrix $H_i$ is a matrix with $r_i$ rows and $n_i$ columns. For each layer, a $(n_i-r_i) \times 1$ vector of input information bits $s_i$ is encoded to a $n_i \times 1$ codeword. The encoding for the first layer is shown below. By performing transportation, $$W_1 H_1 = (P_1 I) \qquad \text{eq.(1)}$$

where matrix $W_1$ is a $r_1 \times r_1$ full rank matrix performing transportation on the matrix $H_1$, $P_1$ is a $r_1 \times (n_1-r_1)$ matrix and the matrix I is the $r_1 \times r_1$ identity matrix. In the example implementation, transportation relates to a matrix representation of linear transportation performed on $H_1$. Transportation is performed such that a generator matrix $P_1$ may be obtained for use in coding. Such operations are used for linear block coding. It will be appreciated by a person skilled in the art that LDPC is a form of linear block coding. Based on the above, the codeword $b_1$ for the $1^{st}$ layer is formed by $$b_1 = (s_1 (s_1 P_1^T)) \qquad \text{eq.(2)}$$

Therefore, the linear block coding is expressed by the parity check matrix $H_1$ and the generator matrix $P_1$ is used for encoding $s_1$ to generate parity bits.

For the i th layer, similarly, by performing transportation, $$W_i H_i = (P_i I) \qquad \text{eq.(3)}$$

and the codeword for the i th layer is formed by $$b_i = \left( s_i \left( s_i P_i^T + \sum_{j<i} b_j C_{j,i}^T W_i^T \right) \right) \qquad \text{eq. (4)}$$

During the encoding for the i th layer, parts of information of previous layers are injected into the codeword of the i th layer by connection matrices $C_{j,i}$ (j=1, ..., i−1).

In the example implementation, decoding for each layer is performed by a sum-product method in the order of layers (i.e., from Layer 1 to Layer M.) That is, higher layer data with higher error protection is decoded first to improve decoding performance. The parity check equation for the first layer is $$H_1 b_1^T = 0 \qquad \text{eq.(5)}$$

Eq. (5) is satisfied when the iterations are terminated for the first layer decoding. Consequently, the parity check equation for an i th layer is $$\sum_{j<i} C_{j,i} b_j^T + H_i b_i^T = 0 \qquad \text{eq. (6)}$$

Eq. (6) is satisfied when the iterations are terminated for the i th layer decoding.

During LDPC decoding, the so-called belief propagation is terminated when all parity check equations are satisfied. In the example implementation, the belief propagation is terminated when the parity check equations involving only detected layers and the layer to be detected are satisfied. In other words, the belief propagation is stopped for i th layer decoding when the $1^{st}$ to i th parity check equations are satisfied.

In the example implementation, in addition to using belief propagation, the decoding procedure is also iterative among the layers. An iterative decoding among the layers may improve the decoding performance gradually. In each such iteration, for an i th layer decoding, message passing is performed from higher layers (i.e., received from 1st to i−1th layers) for verifying the parity check equation. Message passing is also performed from lower layers (i.e., sent to the i+1th to M th layers) for computing the log-likelihood ratio (LLR). The message passing in different directions (see e.g. 510, 512 in FIG. 5) among layers may provide faster and more reliable decoding in the example implementation. The decoding procedure is terminated either when all the involved parity check equations are satisfied (i.e., belief propagation terminated) or when convergence of the LLRs is achieved.

Figure 7:
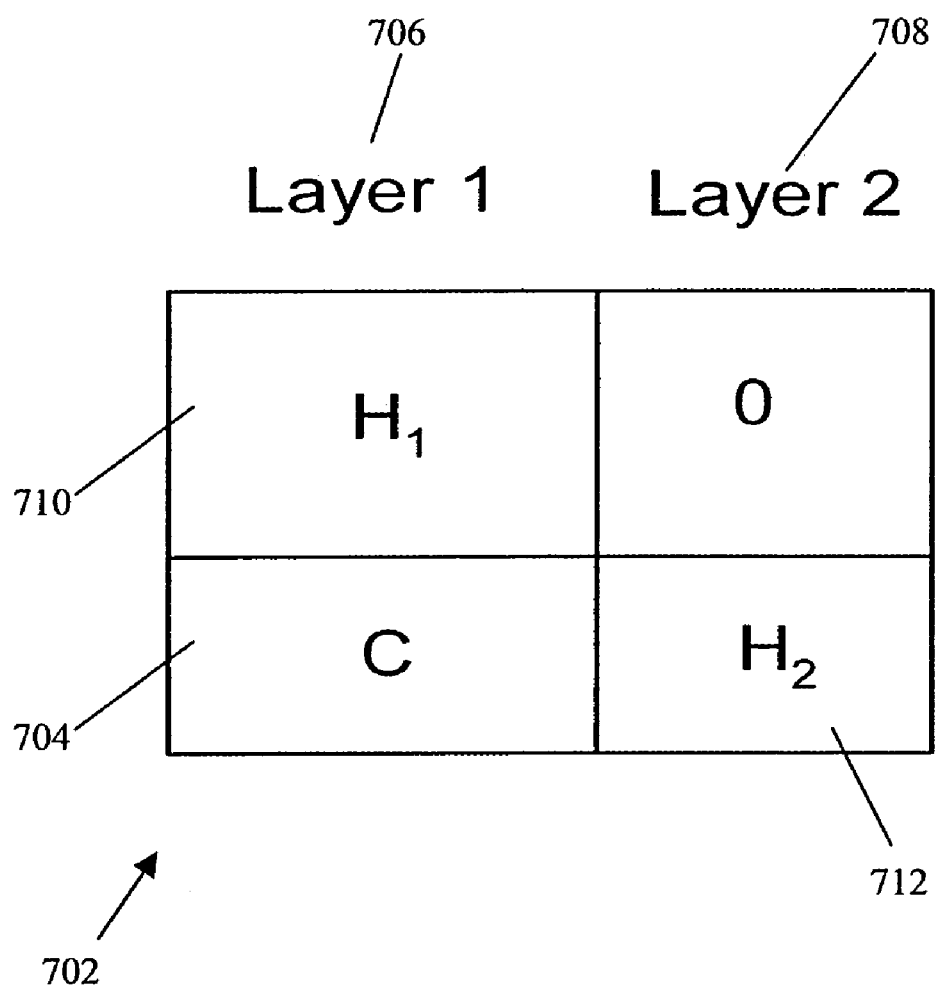
FIG. 7 is a schematic diagram illustrating a sample layered LDPC code.

FIG. 7 is a schematic diagram illustrating a sample layered LDPC code. For description purposes, it is assumed that there are two classes of information bits $s_1$ and $s_2$. Bits of the first class $s_1$ have higher priority and require better error protection and bits of the second class $s_2$ have lower priority and require less robust protection. The structure 702 of the sample two-layer LDPC code is illustrated in FIG. 7. The matrix C 704 is a connection matrix between a first layer 706 and a second layer 708. The bits of the first class $s_1$ are encoded by the first layer 706 of the LDPC code and the bits of the second class $s_2$ are encoded by the second layer 708 of the LDPC code. Thus, the codeword u of the first layer (compare eq. (2)) is obtained as $$u = (s_1(s_1 P_1^T)) \qquad \text{eq.(7)}$$

The codeword v of the second layer (compare eq. (4)) is obtained as $$v = (s_2(s_2 P_2^T + uC^T W_2^T)) \qquad \text{eq.(8)}$$

FIG. 8(a) is an example parity check matrix 800 of the LDPC code of FIG. 7. Since codeword length is related to the number of columns, the codeword length of a first layer 802 is 4 bits. Since the number of parity bits is related to the number of rows, the number of parity bits for the first layer 802 is 3 bits. Therefore, based on the codeword length and the number of parity bits, the number of information bits for the first layer codeword is 1 bit. Consequently, the code rate for the first layer 802 is ¼. Using the same reasoning, the codeword length for a second layer 804 is 4 bits while the code rate for the second layer 804 is ½. Therefore, the first layer codeword is 4 bits comprising 1 bit for information bits and 3 bits for parity bits. The second layer codeword is 4 bits comprising 2 bits for information bits and 2 bits for parity bits. That is, $$u = (\underbrace{u_1}_{\text{information bit}} \underbrace{u_2 \ u_3 \ u_4}_{\text{Parity bits}}) \qquad \text{eq. (9)}$$

$$v = (\underbrace{v_1 \ v_2}_{\text{information bits}} \underbrace{v_3 \ v_4}_{\text{Parity bits}}) \qquad \text{eq. (10)}$$

FIG. 8(b) is another example parity check matrix 806 of the LDPC code of FIG. 7. In this example, the code rate for a first layer 808 is ¼ and the code rate for a second layer 810 is ½. The codeword length of the first layer 808 is 8 bits and the codeword length of the second layer 810 is 4 bits. Therefore, the first layer codeword is 8 bits comprising 2 bits for information bits and 6 bits for parity bits. The second layer codeword is 4 bits comprising 2 bits for information bits and 2 bits for parity bits. That is, $$u = (\underbrace{u_1 u_2}_{\text{information bits}} \underbrace{u_3 \ u_4 \ u_5 \ u_6 \ u_7 \ u_8}_{\text{Parity bits}}) \qquad \text{eq. (11)}$$

$$v = (\underbrace{v_1 \ v_2}_{\text{information bits}} \underbrace{v_3 \ v_4}_{\text{Parity bits}}) \qquad \text{eq. (12)}$$

In the above description, a connection matrix is designed to add degree to a higher layer, thus improving the protection for higher layer data. Therefore, the construction of the parity check matrix, comprising sub codes or sub parity-check matrices and connection matrices, may be used to control unequal error protection.

In the example of FIG. 7, generation of the parity check matrix 702 for the two-layer LDPC code is as follows: A regular LDPC sub-code matrix $H_i$ ($r_i \times n_i$) is generated, taking into account the lowest error protection level of layer i. Parameters such as code rates, codeword lengths, and degrees are selected according to the error probability requirement of each i th layer data. The parameters may be the same or different for different layers. A connection matrix between layers $C_{i,j}$ (m×l matrix, m=$r_j$, l=$n_i$) is then generated. The connection matrix is used for injecting information of one of the input data streams (e.g., encoded using layer 1 of FIG. 7) into the encoding of another one of the input streams (e.g., encoded using layer 2 of FIG. 7).

The assigned error protection level and the lowest error protection level of layer i are compared. If sub-code $H_i$ (compare 710) and sub-code $H_j$ (compare 712) can provide respective required protection for the respective layers of the example in FIG. 7, the connection matrix $C_{i,j}$ (compare 704) is generated as a zero matrix. Thus, the connection matrix $C_{i,j}$ has no effect with respect to the first layer (compare 706) and the second layer (compare 708). On the other hand, if sub-code $H_i$ (compare 710) and sub-code $H_j$ (compare 712) cannot provide respective required protection for the respective layers of the example in FIG. 7, the connection matrix $C_{i,j}$ (compare 704) is generated as a non-zero matrix.

In other words, the lowest error or parity check protection level based on the sub-parity check matrix 710 for the associated input data stream (e.g. encoded using sub-parity check matrix 710 of FIG. 7) is compared to an assigned error or parity check protection level for said input data stream. If the assigned error protection level is equal to (or lower than) the lowest error protection level based on the sub-parity check matrix, the connection matrix $C_{i,j}$ is a zero matrix. If the assigned error protection level is higher than the lowest error protection level, the connection matrix $C_{i,j}$ is a non-zero matrix. Thus, if the connection matrix $C_{i,j}$ is a zero matrix, the protection levels provided by the respective sub-codes of the parity check matrix are the lowest error protection levels.

If the first layer requires more protection, a non-zero $C_{i,j}$ can add degrees to the sub-code $H_i$ to provide better protection for the first layer data. To obtain a suitable LDPC code, the parity check matrix has no cycle in a factor graph. That is, the parity check matrix is designed such that there are no pairs of rows sharing the element "1" in a particular pair of columns. Therefore, the connection matrix $C_{i,j}$ can be designed as follows.

To add one degree to sub-code $H_i$ if the assigned error protection level of layer i is one level higher than the lowest error protection level, the connection matrix $C_{i,j}$ can be generated as $$C^{(1)} = [I_m | I_m | \ldots | I_m] \qquad \text{eq.(13)}$$

Eq. (13) is the concatenation of $$\left\lfloor \frac{l}{m} \right\rfloor + 1$$

times identity matrix $I_m$. By denoting $$C_1 = C^{(1)}[:,1:l] \qquad \text{eq.(14)}$$

the connection matrix may be selected as $C'_{i,j} = C_1$.

To add two degrees to sub-code $H_i$ if the assigned error protection level of layer i is two levels higher than the lowest error protection level, the connection matrix $C_{i,j}$ can be generated as $$C^{(2)} = \left[ I_m^{(2)} | I_m^{(3)} | \ldots | I_m^{\left(2 \lfloor \frac{l}{m} \rfloor\right)} \right] \qquad \text{eq. (15)}$$

where $I_m^{(t)}$ denotes left shifting by t columns for each $I_m$. By denoting $$C_2 = C^{(2)}[:,1:l] \qquad \text{eq.(16)}$$

the connection matrix can be selected as $C'_{i,j} = C_1 + C_2$.

To add k degrees (where k is much smaller than m) to sub-code $H_i$ if the assigned error protection level of layer i is k levels higher than the lowest error protection level, the connection matrix $C_{i,j}$ can be generated as:

$$C^{(k)} = \left[ I_m^{(2(k-1))} | I_m^{(2(k-1)+1)} | \ldots | I_m^{\left(2(k-1)+\lfloor \frac{l}{m} \rfloor\right)} \right], \qquad \text{eq. (17)}$$

where $I_m^{(j)}$ denotes left shifting by j columns for each $I_m$. By denoting $$C_k = C^{(k)}[:,1:l] \qquad \text{eq.(18)}$$

the connection matrix can be selected as $C'_{i,j} = C_1 + C_2 + \ldots + C_k$.

As a final step, the connection matrix $C_{i,j}$ is obtained by down shifting by (i−1) rows for the $C'_{i,j}$.

Figure 9A:
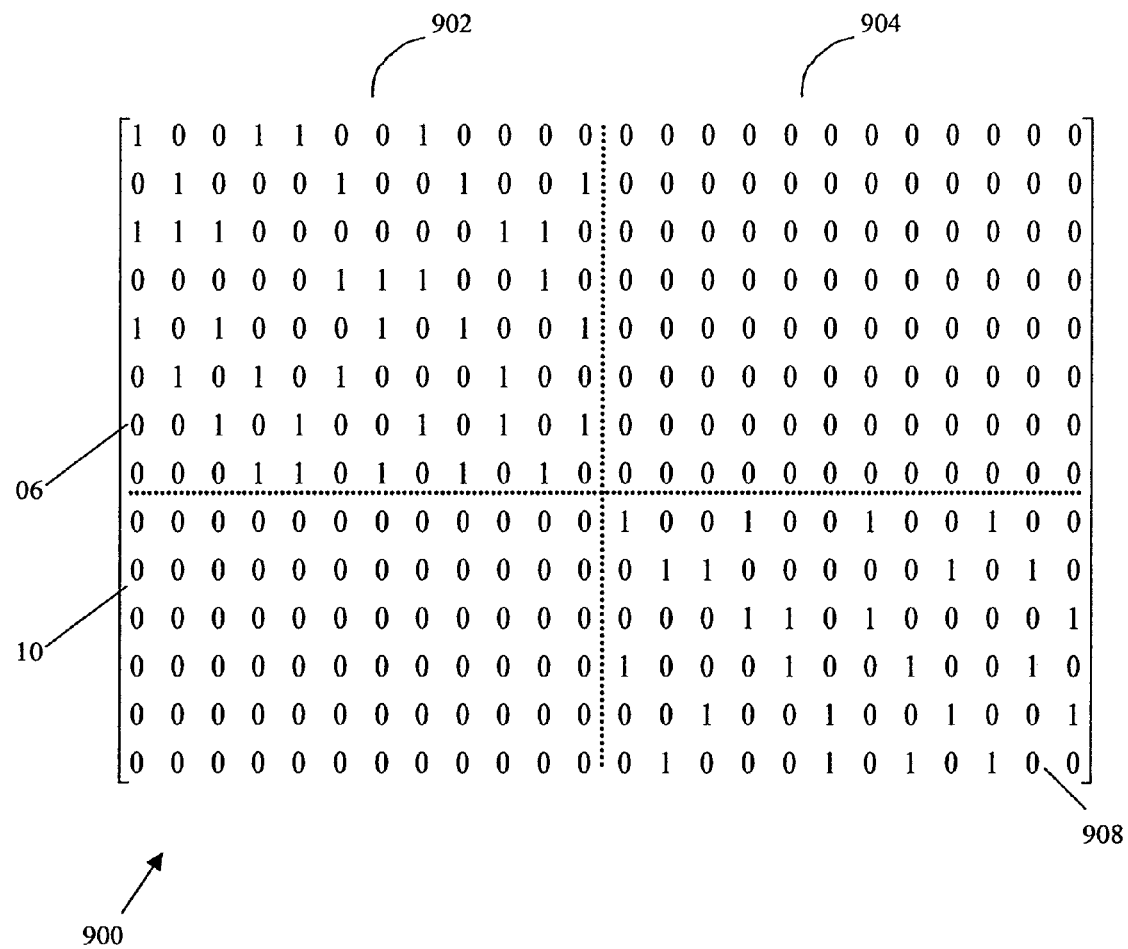
FIGS. 9(a) to 9(c) illustrate an example parity check matrix implementing a connection matrix generation rule.
Figure 9B:
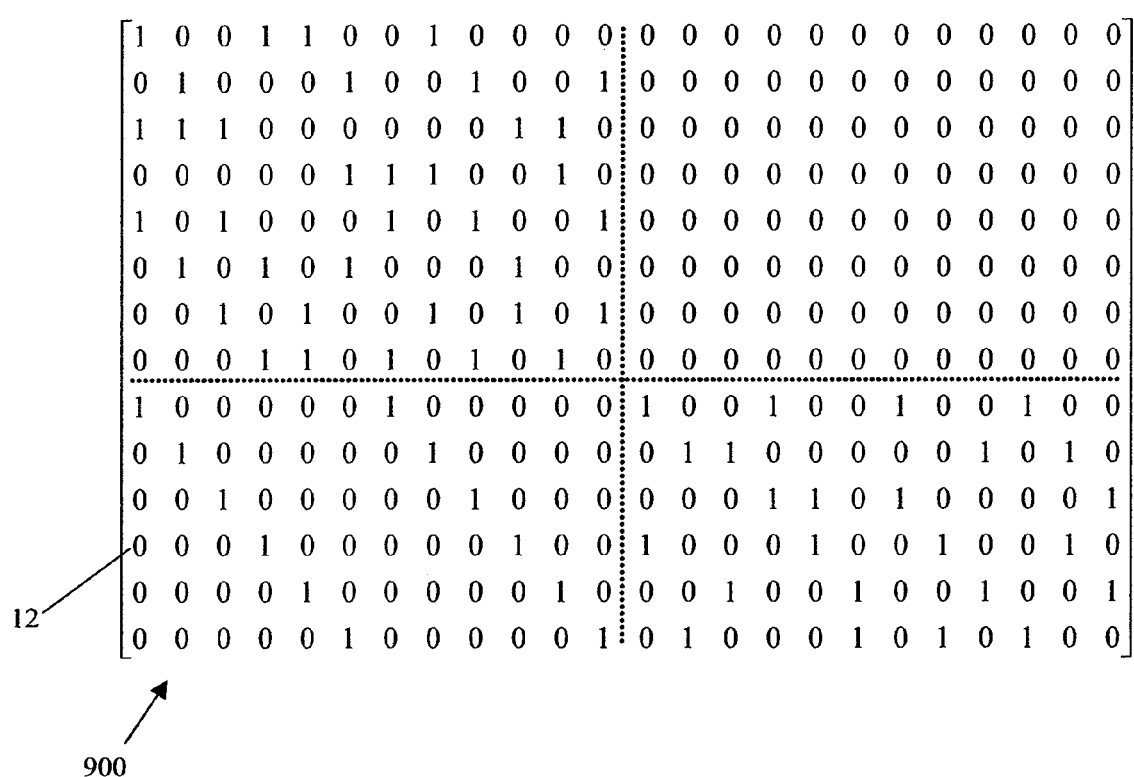
Figure 9C:
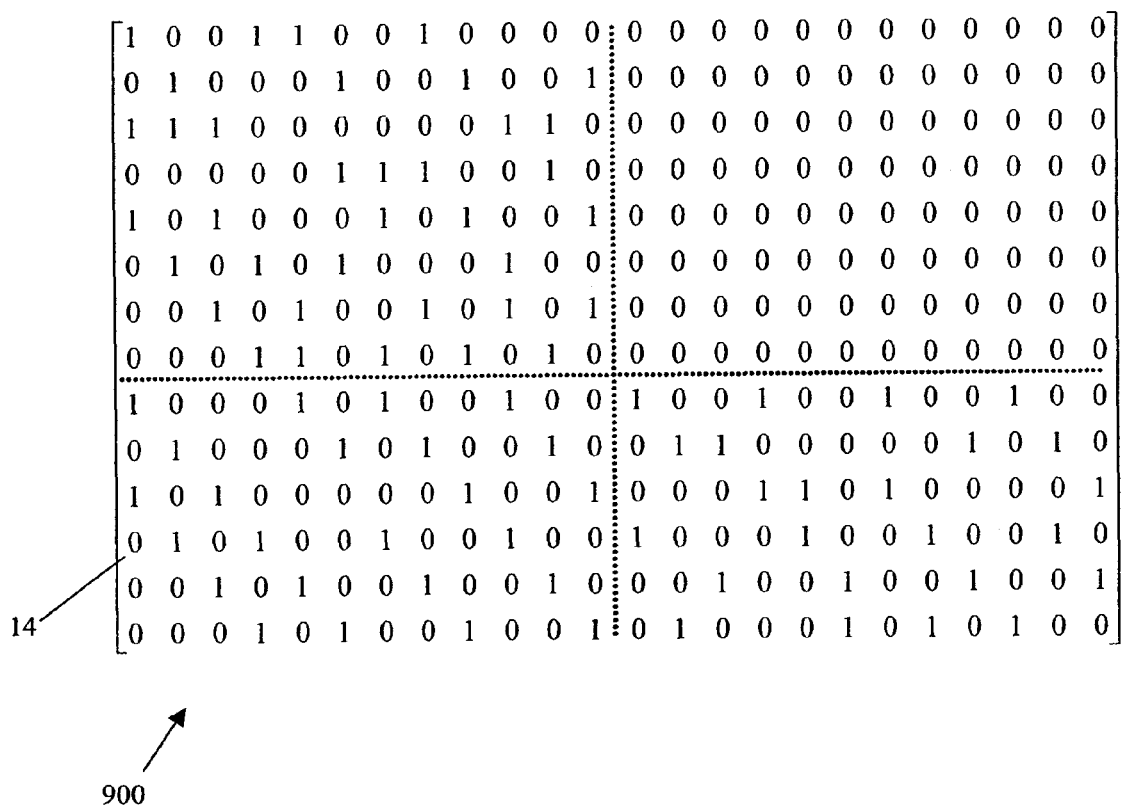

FIGS. 9(a) to 9(c) illustrate an example parity check matrix 900 implementing the above connection matrix generation rule. The two-layer parity check matrix 900 is provided with a first layer 902 and a second layer 904. For the first layer 902, the code rate is ⅓ and the corresponding sub-code $H_1$ 906 is a 8×12 matrix having a column degree of 3 degrees. For the second layer 904, the code rate is ½, and the corresponding sub-code $H_2$ 908 is a 6×12 matrix with a column degree as 2 degrees. The connection matrix C 910 is a 6×12 zero matrix.

FIG. 9(a) shows the connection matrix C 910 being a zero matrix. Thus, the respective protection levels provided by the sub-code $H_1$ 906 and the sub-code $H_2$ 908 are the lowest protection levels for the respective first layer 902 and the second layer 904.

For adding one degree to the first layer 902 to provide better protection, the parity check matrix H 900 can be changed as illustrated in FIG. 9(b). The connection matrix C 910 is changed to a non-zero matrix C 912. The non-zero matrix C 912 is obtained from the matrix C 910 based on eq(13) and eq(14).

For adding two degrees to the first layer 902 to provide better protection, the parity check matrix H 900 can be changed illustrated in FIG. 9(c). The connection matrix C 912 is changed to a connection matrix C 914. The connection matrix C 914 contains more "1" elements as compared to the connection matrix C 912. The connection matrix C 914 is obtained from the connection matrix C 912 based on eq(15) and eq(16).

It will be appreciated by a person skilled in the art that, in order to be a sparse matrix; the parity check matrix 900 may be very large in practical applications.

Figure 10:
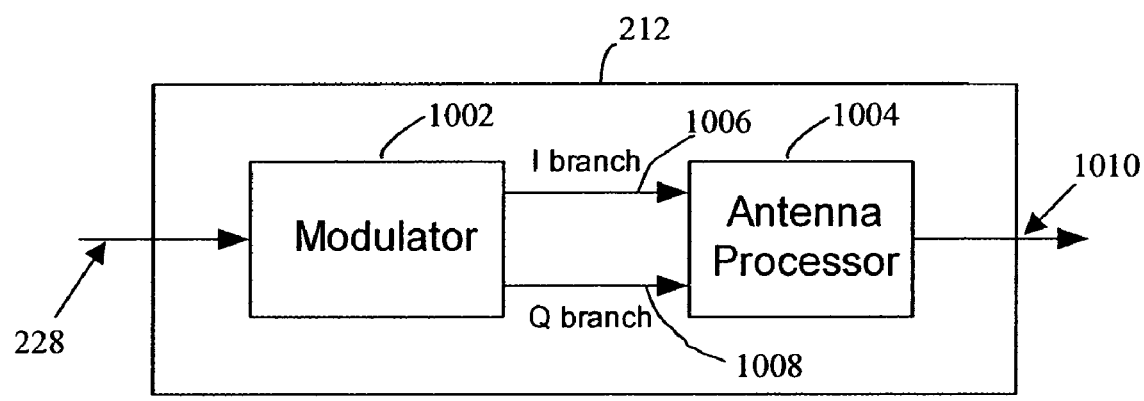
FIG. 10 is a block diagram illustrating a modulation/symbol mapping unit.

FIG. 10 is a block diagram illustrating the modulation/symbol mapping unit 212 (FIG. 2). The other modulation/symbol mapping units 214 function substantially identical to the modulation/symbol mapping unit 212. Input data at numeral 228 are modulated by a modulator 1002 utilizing a modulation scheme that modulates the input data in terms of the in-phase and quadrature phase components to transmit different subsets of the data. An antenna processor 1004 is provided to arrange the I-branch 1006 and Q-branch 1008 data to the antenna transmission stream at numeral 1010. The antenna processor 1004 may provide orthogonal (or near-orthogonal) signal spreading for transmit diversity in wireless transmissions.

It will be appreciated by a person skilled in the art that demodulation and demapping operations performed by the demodulation/demapping units 308, 310 (FIG. 3) are inverse processing of the modulation and mapping operations described above.

FIGS. 11(a) to 11(c) are I-branch/Q-branch tables 1102, 1104, 1106, 1108, 1110, 1112, 1114 and 1116 for illustrating examples of logical signal mapping and combining of systematic/information and parity data. Spatial mapping can map M layer encoded data into $N_T$ (the number of antennas) transmission streams. Using the signal mapping formats described below, the bits from each layer data are distributed in as many symbols as possible to achieve higher frequency diversity.

Using the modulation/symbol mapping unit 212 (FIG. 10), signal mapping formats are provided to map M classes of information bits to $N_T$ transmission streams with Quadrature Phase Shift Keying (QPSK) modulation. In FIG. 11(a), a signal mapping format is used in association with the LDPC codes of FIG. 8(a) to map two (M=2) classes of information bits to ($N_T$=2) two antenna transmission streams. In FIG. 11(b), another signal mapping format is used in association with the LDPC codes of FIG. 8(b) to map two (M=2) classes of information bits to ($N_T$=2) two antenna transmission streams. In FIG. 11(c), yet another signal mapping format is used in association with the LDPC codes of FIG. 8(b) to map two (M=2) classes of information bits to ($N_T$=4) four antenna transmission streams.

Using the signal mapping formats illustrated using FIG. 11(a) and FIG. 11(b), information bits and some parity bits of class 1 and information bits of class 2 are mapped to a first antenna transmission stream (compare Table 1102 with elements of eq. (9) and (10) and Table 1106 with elements of eq. (11) and (12)). The remaining parity bits of class 1 and the parity bits of class 2 are mapped to a second antenna transmission stream (compare Table 1104 with elements of eq. (9) and (10) and Table 1108 with elements of eq. (11) and (12)). By implementing the signal mapping formats, the two classes of bits are distributed in every symbol to achieve higher frequency diversity for Orthogonal Frequency Division Multiplexing (OFDM) transmission. As illustrated in the above examples, the first class data with higher priority are provided better error protection (e.g., more parity bits) and in the example illustrated in FIG. 11(a), the second class data with lower priority achieve a higher transmission rate (i.e., transmission of $v_1(1)$, $v_2(1)$ to $v_1(4)$, $v_2(4)$ in one transmission). The transmissions of subsequent codewords are according to the above signal mapping formats.

Referring to the signal mapping format illustrated in FIG. 11(c), information bits and some parity bits of the first layer and information bits and parity bits of the second layer are mapped to symbols streams to be transmitted by the first and second antennas. The remaining parity bits of the first layer and information bits and parity bits of the second layer are mapped to symbol streams to be transmitted by the third and fourth antennas. (Compare Tables 1110, 1112, 1114, 1116 with elements of eq. (11) and (12). For description purposes, the notations in FIGS. 11(a) to (c) are given as: $u'_i(k)$ or $v'_i(k)$, where i is the i-th digit in a sub codeword from one layer and k is the index of a sub codeword. Using the illustrated signal mapping formats, coded bits from two layers are distributed in every symbol to achieve higher frequency diversity for OFDM transmission. By comparing the signal mapping format for four transmission antennas ($N_T$=4) illustrated in FIG. 11(c) and the signal mapping formats for two transmission antennas ($N_T$=2) illustrated in FIGS. 11(a) and (b), it can be shown that the signal mapping formats follow the same principle. The principle is to spread signals from each layer to available transmission antennas to achieve spatial diversity and to available sub-carriers in the case of OFDM transmission to achieve frequency diversity.

As shown in FIGS. 11(a) to (c), the data with higher priority are provided better error protection and the data with lower priority can achieve higher transmission rates.

Figure 12:
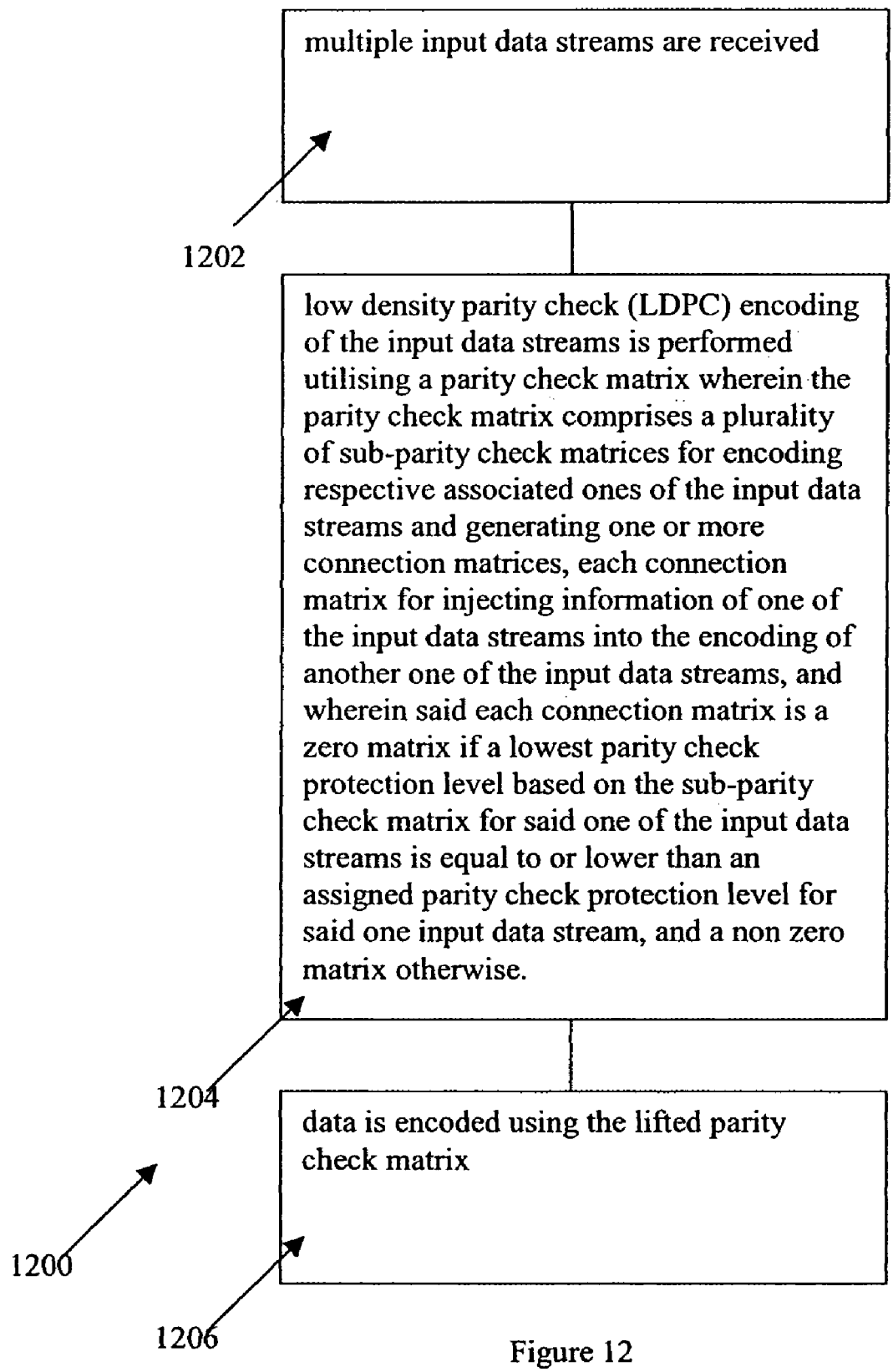
FIG. 12 is a flowchart illustrating a method for data transmission in a multiple input multiple output (MIMO) system.

FIG. 12 is a flowchart 1200 illustrating a method for data transmission in a multiple input multiple output (MIMO) system. At step 1202, multiple input data streams are received. At step 1204, low density parity check (LDPC) encoding of the input data streams is performed utilising a parity check matrix wherein the parity check matrix comprises a plurality of sub-parity check matrices for encoding respective associated ones of the input data streams and generating one or more connection matrices, each connection matrix for injecting information of one of the input data streams into the encoding of another one of the input data streams, and wherein said each connection matrix is a zero matrix if a lowest parity check protection level based on the sub-parity check matrix for said one of the input data streams is equal to or lower than an assigned parity check protection level for said one input data stream, and a non zero matrix otherwise. At step 1206, space time encoding is performed for transmitting the LDPC encoded input data streams over a plurality of antennas.

Figure 13:
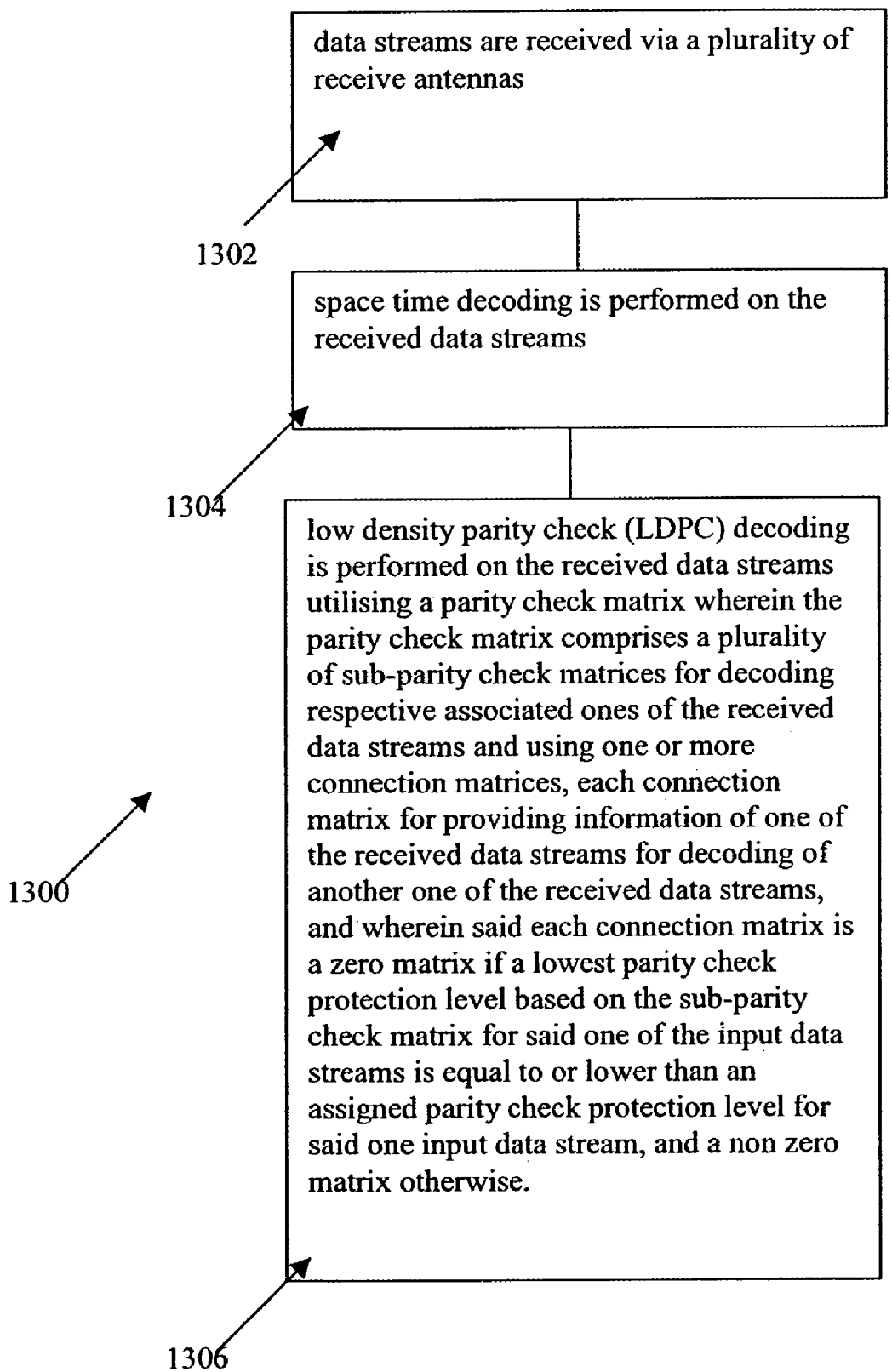
FIG. 13 is a flowchart illustrating a method for processing received data streams in a multiple input multiple output (MIMO) system.

FIG. 13 is a flowchart 1300 illustrating a method for processing received data streams in a multiple input multiple output (MIMO) system. At step 1302, data streams are received via a plurality of receive antennas. At step 1304, space time decoding is performed on the received data streams. At step 1306, low density parity check (LDPC) decoding is performed on the received data streams utilising a parity check matrix wherein the parity check matrix comprises a plurality of sub-parity check matrices for decoding respective associated ones of the received data streams and using one or more connection matrices, each connection matrix for providing information of one of the received data streams for decoding of another one of the received data streams, and wherein said each connection matrix is a zero matrix if a lowest parity check protection level based on the sub-parity check matrix for said one of the input data streams is equal to or lower than an assigned parity check protection level for said one input data stream, and a non zero matrix otherwise.

The above example implementation may provide for transmitting and receiving multiple content data (e.g., MBMS services) with different error protections in wireless communication systems. The example implementation may be used for a physical layer transmission for broadcast and multicast services. Unequal error protection for simultaneous different MBMS delivery may be provided by employing the LDPC coding together with space-time processing, and may be implemented in any wireless MIMO system. The requirements on quality of error protection and data rate may be achieved by using a layer structure of LDPC and various space-time mapping schemes for different priority data.

The above example implementation may provide a combined system for supporting simultaneously various error protection requirements in high rate data transmission systems (e.g., 3GPP MBMS) at a high system flexibility and low implementation complexity. The arrangement of the transmission rate and protection robustness of the services may be jointly controlled by a Layer LDPC encoder which may assign various code rates, codeword lengths and check degrees to different data with different priorities and a space-time mapper which may provide different space-time processing for different data.

It has been recognised that various channel coding schemes and space-time processing techniques may provide different levels of protection to the distortion of the transmitted data due to the fading and the noise, and may achieve different levels of data transmission rate. By using coding schemes and space-time processing techniques, a more robust transmission may be provided to higher priority data while a higher transmission rate may be provided to lower priority data. In addition, by using the above example implementation, further protection may be achieved while capacity may be increased at the same time.

Furthermore, different protection for service/data with different priorities may be supported by designing the layer structure of the LDPC code and the space-time mapping scheme. In the above example implementation, different code rates and/or codeword lengths for different data may be achieved by designing a layered LDPC parity check matrix (where a layer corresponds to a priority level). In addition, higher diversity in the space, time and frequency domains may be achieved via distributed signal mapping. Space time mapping in the described example implementation may be performed for data with different priority by multiplexing/demultiplexing and mapping to realise various space-time coding for different information data.

In the above example implementation, different content data with different priority (or different services with different error probability requirements) are processed in accordance with a layered LDPC channel coding scheme and may have different code rates and/or different codeword lengths, for each layer corresponding to different priority data. The information and parity data may be multiplexed/demultiplexed and mapped to a plurality of antenna transmission streams. The multiplexing and mapping may control the space-time coding structure that is applied to different content data and hence, may provide different protection and/or transmission rates for different content data.

It will be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

The invention claimed is:

1. A method for data transmission in a multiple input multiple output (MIMO) system, the method comprising:
   receiving multiple input data streams;
   performing low density parity check (LDPC) encoding of the input data streams utilising a parity check matrix, wherein the parity check matrix comprises a plurality of sub-parity check matrices for encoding respective associated ones of the input data streams and
   performing space time encoding for transmitting the LDPC encoded input data streams over a plurality of antennas;
   wherein the performing of the LDPC encoding of the input data streams comprises generating one or more connection matrices, each connection matrix for injecting information of one of the input data streams into the encoding of another one of the input data streams; and
   wherein said each connection matrix is a zero matrix if a lowest parity check protection level based on the sub-parity check matrix for said one of the input data streams is equal to or lower than an assigned parity check protection level for said one input data stream, and a non zero matrix otherwise.

2. The method as claimed in claim 1, wherein the multiple input data streams comprise M input streams of M different classes, and the parity check matrix has M layers, each layer of the parity check matrix corresponding to one of the M classes.

3. The method as claimed in claim 2, wherein each connection matrix links two of the M layers such that the correlation information between the two layers is injected during the LDPC encoding.

4. The method as claimed in claim 1, wherein for each connection matrix, if the assigned parity check protection level is k levels higher than the lowest parity check protection level, said each connection matrix is generated using the steps of:
   providing a matrix $$C^{(k)} = \left[ I_m^{(2(k-1))} | I_m^{(2(k-1)+1)} | \ldots | I_m^{\left(2(k-1)+\lfloor \frac{l}{m} \rfloor\right)} \right],$$

where $m=r_i$, $l=n_i$, $r_i$ is a number of parity check bits of said one of the input data streams and $n_i$ is a codeword length of said one of the input data streams and $I_m^{(t)}$ is a t-column left shift operation of an identity matrix $I_m$;
   denoting $C_k = C^{(k)}[:,1:l]$;
   denoting $C'_{i,j} = C_1 + C_2 + \ldots + C_k$; and
   downshifting $C'_{i,j}$ by (i−1) rows to obtain said each connection matrix.

5. The method as claimed in claim 1, wherein the parity check matrix is a block-wise low triangular matrix, with the sub-parity check matrices located as blocks along a main diagonal of the parity check matrix.

6. The method as claimed in claim 5, wherein the connection matrices are located as blocks below the main diagonal of the parity check matrix, with blocks above the main diagonal being zero matrices.

7. A transmitter in a multiple input multiple output (MIMO) system, the transmitter comprising:
   one or more input units for receiving multiple input data streams;
   a low density parity check (LDPC) encoder; and
   a spatial mapping unit;
   wherein the LDPC encoder performs LDPC encoding of the input data streams utilising a parity check matrix and the parity check matrix comprises a plurality of sub-parity check matrices for encoding respective associated ones of the input data streams and the spatial mapping unit performs space time encoding for transmitting the LDPC encoded input data streams over a plurality of antennas;
   wherein for the performing of the LDPC encoding of the input data streams, the LDPC encoder generates one or more connection matrices, each connection matrix for injecting information of one of the input data streams into the encoding of another one of the input data streams; and
   wherein said each connection matrix is a zero matrix if a lowest parity check protection level based on the sub-parity check matrix for said one of the input data streams is equal to or lower than an assigned parity check protection level for said one input data stream, and a non zero matrix otherwise.

8. The transmitter as claimed in claim 7, wherein the multiple input data streams comprise M input streams of M different classes, and the parity check matrix has M layers, each layer of the parity check matrix corresponding to one of the M classes.

9. The transmitter as claimed in claim 8, wherein each connection matrix links two of the M layers such that the correlation information between the two layers is included during the LDPC encoding.

10. The transmitter as claimed in claim 7, wherein for each connection matrix, if the assigned parity check protection level is assigned to be k levels higher than the lowest parity check protection level, the LDPC encoder generates said each connection matrix using the steps of:
   providing a matrix $$C^{(k)} = \left[ I_m^{(2(k-1))} | I_m^{(2(k-1)+1)} | \ldots | I_m^{\left(2(k-1)+\lfloor \frac{l}{m} \rfloor\right)} \right],$$

where $m=r_i$, $l=n_i$, $r_i$ is a number of parity check bits of said one of the input data streams and $n_i$ is a codeword length of said one of the input data streams and $I_m^{(t)}$ is a t-column left shift operation of an identity matrix $I_m$;
   denoting $C_k = C^{(k)}[:,1:l]$;
   denoting $C'_{i,j} = C_1 + C_2 + \ldots + C_k$; and
   downshifting $C'_{i,j}$ by (i−1) rows to obtain said each connection matrix.

11. The transmitter as claimed in claim 7, wherein the parity check matrix is a block-wise low triangular matrix, with the sub-parity check matrices located as blocks along a main diagonal of the parity check matrix.

12. The transmitter as claimed in claim 11, wherein the connection matrices are located as blocks below the main diagonal of the parity check matrix, with blocks above the main diagonal being zero matrices.

13. A computer readable data storage medium having stored thereon computer code means for instructing a multiple input multiple output (MIMO) system to execute a method for data transmission in the MIMO system, the method comprising:
   receiving multiple input data streams;
   performing low density parity check (LDPC) encoding of the input data streams utilising a parity check matrix, wherein the parity check matrix comprises a plurality of sub-parity check matrices for encoding respective associated ones of the input data streams; and performing space time encoding for transmitting the LDPC encoded input data streams over a plurality of antennas;

wherein the performing of the LDPC encoding of the input data streams comprises generating one or more connection matrices, each connection matrix for injecting information of one of the input data streams into the encoding of another one of the input data streams; and wherein said each connection matrix is a zero matrix if a lowest parity check protection level based on the sub-parity check matrix for said one of the input data streams is equal to or lower than an assigned parity check protection level for said one input data stream, and a non zero matrix otherwise.

14. A method for processing received data streams in a multiple input multiple output (MIMO) system, the method comprising:

receiving data streams via a plurality of receive antennas;

performing space time decoding on the received data streams; and performing low density parity check (LDPC) decoding of the received data streams utilising a parity check matrix for decoding the data streams, wherein the parity check matrix comprises a plurality of sub-parity check matrices for decoding respective associated ones of the received data streams;

wherein the performing of the LDPC decoding of the received data streams comprises using one or more connection matrices, each connection matrix for providing information of one of the received data streams for decoding of another one of the received data streams, and wherein said each connection matrix is a zero matrix if a lowest parity check protection level based on the sub-parity check matrix for said one of the input data streams is equal to or lower than an assigned parity check protection level for said one input data stream, and a non zero matrix otherwise.

15. The method as claimed in claim 14, further comprising using a sum-product method for decoding the received data streams.

16. A receiver in a multiple input multiple output (MIMO) system, the receiver comprising:

a plurality of receive antennas for receiving data streams;

a spatial mapping decoder for performing space time decoding on the received data streams; and a low density parity check (LDPC) decoder for decoding the received data streams utilising a parity check matrix for decoding the data streams, wherein the parity check matrix comprises a plurality of sub-parity check matrices for decoding respective associated ones of the received data streams;

wherein for the performing of the LDPC decoding of the received data streams, the LDPC decoder uses one or more connection matrices, each connection matrix for providing information of one of the received data streams for decoding of another one of the received data streams; and wherein said each connection matrix is a zero matrix if a lowest parity check protection level based on the sub-parity check matrix for said one of the input data streams is equal to or lower than an assigned parity check protection level for said one input data stream, and a non zero matrix otherwise.

17. The receiver as claimed in claim 16, wherein the LDPC decoder comprises one or more sum-product decoders.

18. A computer readable data storage medium having stored thereon computer code means for instructing a multiple input multiple output (MIMO) system to execute a method for processing received data streams in the MIMO system, the method comprising:

receiving data streams via a plurality of receive antennas;

performing space time decoding on the received data streams; and performing low density parity check (LDPC) decoding of the received data streams utilising a parity check matrix for decoding the data streams, wherein the parity check matrix comprises a plurality of sub-parity check matrices for decoding respective associated ones of the received data streams;

wherein the performing of the LDPC decoding of the received data streams comprises using one or more connection matrices, each connection matrix for providing information of one of the received data streams for decoding of another one of the received data streams; and wherein said each connection matrix is a zero matrix if a lowest parity check protection level based on the sub-parity check matrix for said one of the input data streams is equal to or lower than an assigned parity check protection level for said one input data stream, and a non zero matrix otherwise.

* * * * *